US012518981B2

(12) United States Patent
Kamimura et al.

(10) Patent No.: US 12,518,981 B2
(45) Date of Patent: *Jan. 6, 2026

(54) SUBSTRATE PROCESSING APPARATUS, METHOD OF MANUFACTURING SEMICONDUCTOR DEVICE, AND RECORDING MEDIUM

(71) Applicant: Kokusai Electric Corporation, Tokyo (JP)

(72) Inventors: Daigi Kamimura, Toyama (JP); Tomoshi Taniyama, Toyama (JP); Kenji Shirako, Toyama (JP); Hironori Shimada, Toyama (JP); Akira Horii, Toyama (JP); Takayuki Nakada, Toyama (JP); Norihiro Yamashima, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/607,968

(22) Filed: Mar. 18, 2024

(65) Prior Publication Data

US 2024/0224238 A1    Jul. 4, 2024

Related U.S. Application Data

(63) Continuation of application No. 17/889,054, filed on Aug. 16, 2022, now Pat. No. 11,935,762, which is a
(Continued)

(30) Foreign Application Priority Data

Mar. 27, 2020 (JP) .................................. 2020-057564

(51) Int. Cl.
*H01J 37/32*    (2006.01)
*C23C 16/44*    (2006.01)
(Continued)

(52) U.S. Cl.
CPC .... *H01L 21/67017* (2013.01); *C23C 16/4412* (2013.01); *C23C 16/4588* (2013.01);
(Continued)

(58) Field of Classification Search
CPC ......... H01L 21/67017; H01L 21/67098; C23C 16/4412; C23C 16/4588; C23C 16/46; H01J 37/32834; H01J 2237/332–3348
(Continued)

(56) References Cited

U.S. PATENT DOCUMENTS 5,307,568 A * 5/1994 Matsuo ............. H01J 37/32871
34/92
5,578,132 A    11/1996 Yamaga et al.
(Continued)

FOREIGN PATENT DOCUMENTS

JP    S60-048233 U    4/1985
JP    H04-026762 A    1/1992
(Continued)

OTHER PUBLICATIONS

Korean Office Action issued on Apr. 9, 2024 for Korean Patent Application No. 10-2024-0023401.
(Continued)

*Primary Examiner* — Charlee J. C. Bennett
(74) *Attorney, Agent, or Firm* — Volpe Koenig

(57) ABSTRACT

A substrate processing apparatus includes: a processing module including a process container in which at least one substrate is processed and a substrate loading port installed at a front side of the processing module, a utility system including a supply system which supplies a processing gas into the first process container and a surface of the first utility system is connected or arranged close to a rear surface of the processing module; a vacuum-exhauster behind the processing module and configured to exhaust an inside of
(Continued)

the process container; an exhaust pipe that brings the process container into fluid communication with the vacuum-exhauster; a pipe housing which supports the exhaust pipe; and a first vibration-damping fastener connecting the vacuum-exhauster and the pipe housing. The exhaust pipe includes a first flexible portion that allows displacement of the exhaust pipe's end, and the vacuum-exhauster and pipe housing are installed at a floor.

20 Claims, 18 Drawing Sheets

Related U.S. Application Data continuation of application No. 17/211,951, filed on Mar. 25, 2021, now Pat. No. 11,450,536.

(51) Int. Cl.
| | | |
|---|---|---|
| *C23C 16/458* | (2006.01) | |
| *C23C 16/46* | (2006.01) | |
| *H01L 21/67* | (2006.01) | |
| *H04W 72/02* | (2009.01) | |
| *H04W 72/0446* | (2023.01) | |
| *H04W 72/0453* | (2023.01) | |
| *H04W 72/20* | (2023.01) | |

(52) U.S. Cl.
CPC .......... *C23C 16/46* (2013.01); *H01J 37/3244* (2013.01); *H01J 37/32834* (2013.01); *H01L 21/67098* (2013.01); *H04W 72/02* (2013.01); *H04W 72/0446* (2013.01); *H04W 72/0453* (2013.01); *H04W 72/20* (2023.01); *H01J 2237/332* (2013.01)

(58) Field of Classification Search
USPC ................ 118/715–720, 715–733; 438/758; 156/345.1–345.55
See application file for complete search history.

(56) References Cited

U.S. PATENT DOCUMENTS

| | | | | |
|---|---|---|---|---|
| 5,788,747 | A * | 8/1998 | Horiuchi | B01D 50/00 |
| | | | | 118/723 VE |
| 6,103,079 | A * | 8/2000 | Kuo | C23C 14/564 |
| | | | | 48/194 |
| 8,181,944 | B2 | 5/2012 | Brewster | |
| 9,646,821 | B2 | 5/2017 | Yamamoto et al. | |
| 10,163,663 | B2 | 12/2018 | Yonejima et al. | |
| 10,636,681 | B2 | 4/2020 | Kamimura et al. | |
| 11,935,762 | B2 * | 3/2024 | Kamimura | H01L 21/67098 |
| 2002/0164883 | A1 * | 11/2002 | Ohmi | H01L 21/02274 |
| | | | | 438/726 |
| 2003/0035737 | A1 * | 2/2003 | Ishikawa | F04D 29/668 |
| | | | | 417/423.4 |
| 2007/0032045 | A1 | 2/2007 | Kasahara et al. | |
| 2008/0023896 | A1 * | 1/2008 | Brewster | F04D 29/668 |
| | | | | 267/140.11 |
| 2008/0026598 | A1 * | 1/2008 | Jang | C23C 16/4401 |
| | | | | 438/795 |
| 2008/0085202 | A1 | 4/2008 | Namiki et al. | |
| 2012/0006264 | A1 | 1/2012 | Ukigaya et al. | |
| 2012/0091362 | A1 * | 4/2012 | Tsuji | H01J 37/16 |
| | | | | 250/441.11 |
| 2012/0118229 | A1 * | 5/2012 | Shimada | C23C 16/458 |
| | | | | 137/15.01 |
| 2013/0112598 | A1 * | 5/2013 | Culver | B03B 7/00 |
| | | | | 209/10 |
| 2014/0291980 | A1 * | 10/2014 | Miyamoto | F04D 29/605 |
| | | | | 29/428 |
| 2015/0107515 | A1 | 4/2015 | Shimada | |
| 2016/0053377 | A1 | 2/2016 | Taniyama | |
| 2018/0085799 | A1 * | 3/2018 | Miyazaki | C23C 16/4412 |
| 2018/0144913 | A1 * | 5/2018 | Dronhofer | H01J 37/3488 |
| 2018/0144953 | A1 * | 5/2018 | Yonejima | H01L 21/6719 |
| 2019/0198359 | A1 * | 6/2019 | Kamimura | H01L 21/67178 |
| 2020/0013639 | A1 | 1/2020 | Kamimura et al. | |
| 2020/0071821 | A1 * | 3/2020 | Shirako | H01L 21/6719 |
| 2020/0392620 | A1 * | 12/2020 | Okuno | C23C 16/54 |
| 2021/0040619 | A1 * | 2/2021 | Yachi | H01L 21/67017 |
| 2021/0062940 | A1 * | 3/2021 | Cho | F16L 11/15 |
| 2021/0217634 | A1 | 7/2021 | Kamimura et al. | |
| 2023/0016879 | A1 | 1/2023 | Kamimura et al. | |

FOREIGN PATENT DOCUMENTS

| | | |
|---|---|---|
| JP | H05-068826 A | 3/1993 |
| JP | H07-066145 A | 3/1995 |
| JP | 07-240382 A | 9/1995 |
| JP | 2004-157352 A | 6/2004 |
| JP | 2007-218677 A | 8/2007 |
| JP | 2012-099763 A | 5/2012 |
| JP | 2012-104755 A | 5/2012 |
| JP | 2012-215252 A | 11/2012 |
| JP | 2018-155333 A | 10/2018 |
| JP | 6484601 B2 | 3/2019 |
| KR | 10-0352379 B1 | 11/2002 |
| KR | 10-2018-0054788 A | 5/2018 |
| KR | 10-2018-0058639 A | 6/2018 |
| KR | 2018-0063310 A | 6/2018 |
| TW | I313890 B | 8/2009 |
| WO | 2018/003072 A1 | 1/2018 |
| WO | 2019/172274 A1 | 9/2019 |

OTHER PUBLICATIONS

Singapore Search Report issued on Mar. 21, 2022 for Singapore Application No. 10202103085W.
Singapore Written Opinion issued on Mar. 21, 2022 for Singapore Application No. 10202103085W.
Taiwan Office Action issued on Nov. 25, 2021 for Taiwan Patent Application No. 110110184.
Korean Office Action issued on Feb. 23, 2023 for Korean Patent Application No. 10-2021-0039568.
Taiwan Office Action issued on May 29, 2023 for Taiwan Patent Application No. 11119470.
Japanese Office Action issued on Aug. 29, 2023 for Japanese Patent Application No. 2022-188195.
Singapore Search Report issued on Jul. 9, 2024 for Singapore Patent Application No. 10202250312M.
Singapore Written Opinion issued on Jul. 9, 2024 for Singapore Patent Application No. 10202250312M.
Korean Office Action issued on Mar. 22, 2024 for Korean Patent Application No. 10-2021-0039568.
Taiwan Office Action issued on Mar. 19, 2025 for Taiwan Patent Application No. 113130103.

* cited by examiner

FIG. 7A
FIG. 7B
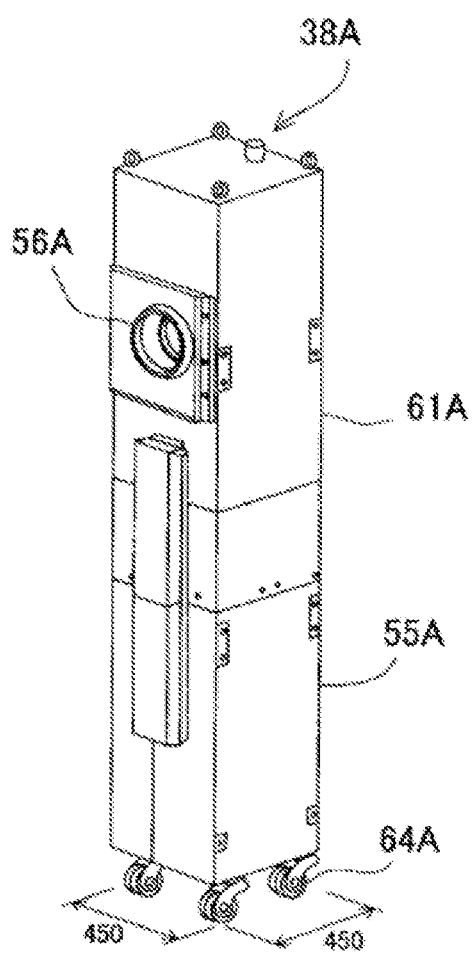
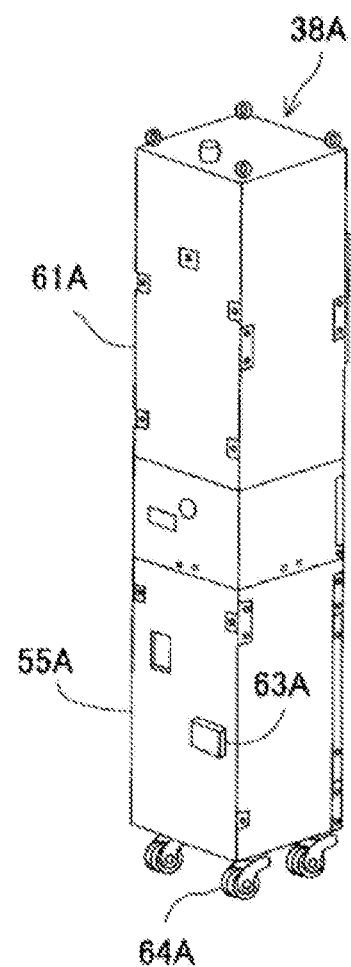

SUBSTRATE PROCESSING APPARATUS, METHOD OF MANUFACTURING SEMICONDUCTOR DEVICE, AND RECORDING MEDIUM

CROSS-REFERENCE TO RELATED APPLICATION

This application is a continuation application of U.S. patent application Ser. No. 17/889,054, filed Aug. 16, 2022, U.S. patent application Ser. No. 17/211,951, filed Mar. 25, 2021, now U.S. patent Ser. No. 11/450,536, issued Sep. 20, 2022, which is based upon and claims the benefit of priority from Japanese Patent Application No. 2020-057564, filed on Mar. 27, 2020, the entire contents of which are incorporated herein by reference.

TECHNICAL FIELD

The present disclosure relates to a substrate processing apparatus configured to perform a process such as thin film formation on a substrate, and a method of manufacturing a semiconductor device.

BACKGROUND

In a method of manufacturing a semiconductor device, a vertical substrate processing apparatus may be used as an apparatus configured to form an oxide film or a metal film on a substrate (hereinafter referred to as a wafer). Further, there is available a substrate processing apparatus including a boat configured to hold wafers and a plurality of process chambers in which the wafers are processed and configured to sequentially load or unload the boat to or from each of the process chambers to process the wafers.

In the substrate processing apparatus of the related art, a maintenance area in which maintenance of each mechanism in the vicinity, for example, on a lateral side, of the substrate processing apparatus is performed may be needed. Therefore, since the substrate processing apparatus are installed considering the maintenance area, a footprint used when the substrate processing apparatus is installed becomes large, and COO (Cost of Ownership) also becomes high.

SUMMARY

Some embodiments of the present disclosure provide a technique capable of improving an exhaust efficiency while reducing a footprint.

According to some embodiments of the present disclosure, there is provided a technique that includes: a first processing module including a first process container in which at least one substrate is processed and a substrate loading port installed at a front side of the first processing module; a first utility system including a first supply system configured to supply a first processing gas into the first process container, a surface of the first utility system is connected or arranged close to a rear surface of the first processing module; and a first vacuum-exhauster arranged behind the first processing module and configured to exhaust an inside of the first process container, wherein the first vacuum-exhauster includes an outer side surface configured such that the outer side surface does not protrude more outward than an outer side surface of the first utility system.

BRIEF DESCRIPTION OF DRAWINGS

The accompanying drawings, which are incorporated in and constitute a part of the specification, illustrate embodiments of the present disclosure.

FIGS. 7A and 7B are perspective views showing an example of a booster pump according to embodiments of the present disclosure.

DETAILED DESCRIPTION

Figure 1:
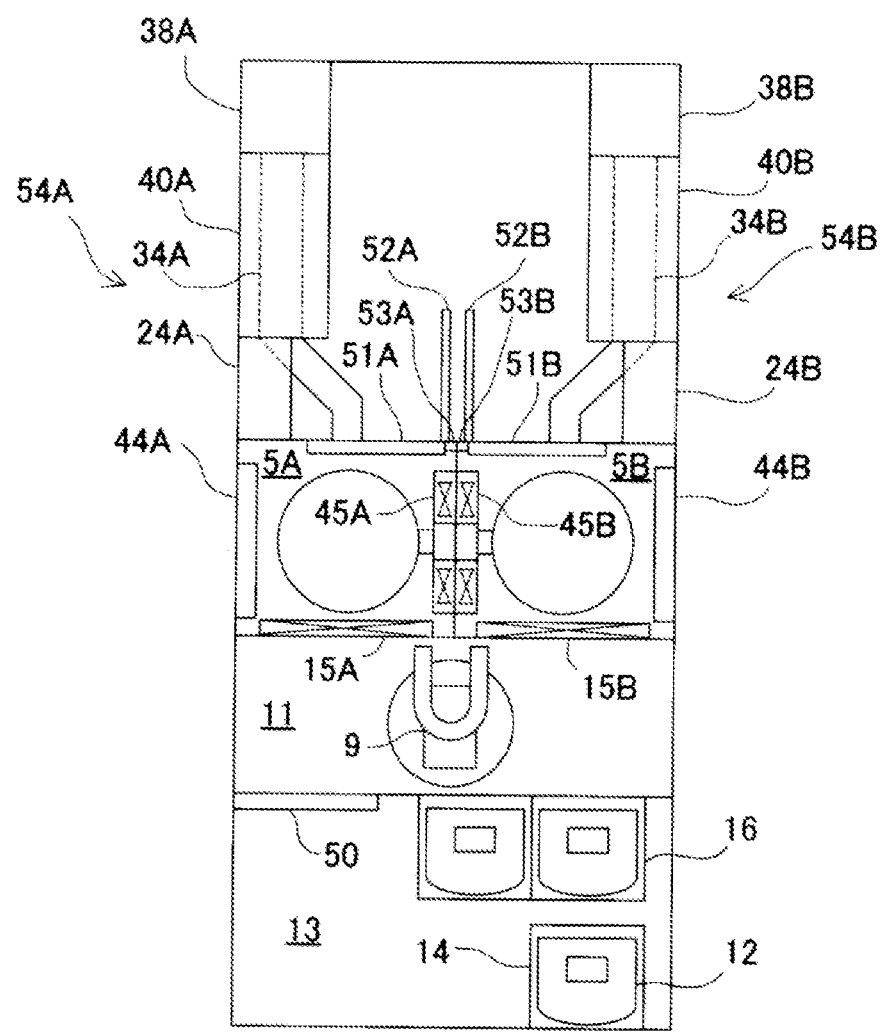
FIG. 1 is a top view showing an example of a substrate processing apparatus according to embodiments of the present disclosure.

Reference will now be made in detail to various embodiments, examples of which are illustrated in the accompanying drawings. In the following detailed description, numerous specific details are set forth to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, non-limiting exemplary embodiments of the present disclosure will be described with reference to the drawings. The drawings used in the following description are all schematic. A dimensional relationship of each element, a ratio of each element, and the like shown in the drawings may not match actual ones. Further, even among the drawings, the dimensional relationship of each element, the ratio of each element, and the like may not always match. Further, throughout the drawings, the same or corresponding configurations are designated by the same or corresponding reference numerals, and duplicate description thereof will be omitted. Further, a side of a storage chamber 13 to be described below is referred to as a front surface side (front side), and a side of a first utility system 54A and a second utility system 54B to be described below is referred to as a rear surface side (rear side). In addition, a side facing a boundary line (adjacent surface) of a first processing module 2A and a second processing module 2B to be described below is referred to as inner side, and a side going away from the boundary line is referred to as outer side.

In the embodiments, a substrate processing apparatus is configured as a vertical substrate processing apparatus (hereinafter referred to as substrate processing apparatus) 1 configured to carry out a substrate processing step such as heat treatment as a manufacturing process in a method of manufacturing a semiconductor device.

Figure 2:
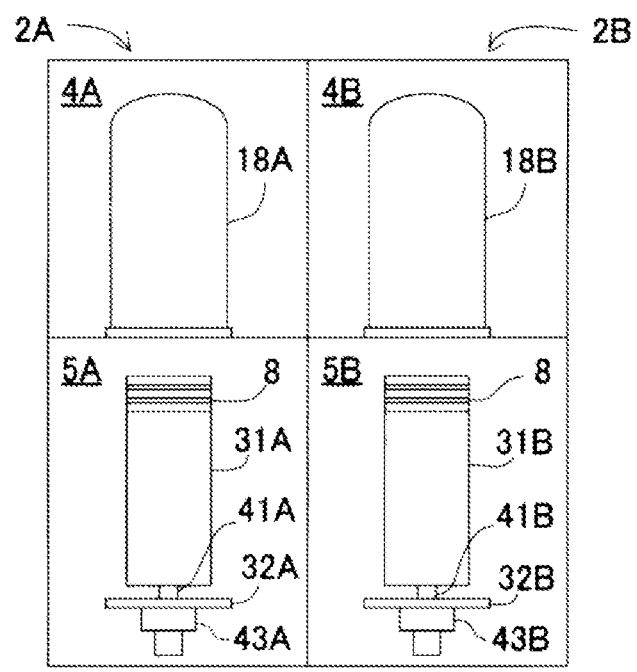
FIG. 2 is a vertical sectional view showing an example of the substrate processing apparatus according to embodiments of the present disclosure.

As shown in FIGS. 1 and 2, the substrate processing apparatus 1 includes a first processing module 2A and a second processing module 2B. The processing modules 2A and 2B include a housing or a skeleton having a substantially rectangular parallelepiped contour. Side surfaces of the respective processing modules 2A and 2B are arranged in close contact with or adjacent to each other to be parallel with each other. The first processing module 2A includes a first process furnace 4A (process furnace 4A) and a first transfer chamber 5A (transfer chamber 5A). The second processing module 2B includes a second process furnace 4B (process furnace 4B) and a second transfer chamber 5B (transfer chamber 5B).

The transfer chamber 5A and the transfer chamber 5B are disposed below the process furnace 4A and the process furnace 4B, respectively. A delivery chamber 11 is disposed adjacent to the front surface sides of the transfer chamber 5A and the transfer chamber 5B. The delivery chamber 11 includes a housing having a substantially rectangular parallelepiped outer shape, and includes a delivery machine 9 configured to deliver a wafer 8. A storage chamber 13 configured to store a pod (FOUP) 12 configured to store a plurality of wafers 8 is connected to the front surface side of the delivery chamber 11. The storage chamber 13, the processing modules 2A and 2B, and the delivery chamber 11 have an outer diameter based on a polyhedron including planes orthogonal to each other, and are respectively configured to be removable. Connectors thereof have appropriate airtightness. An I/O port 14 is installed on the front surface of the storage chamber 13, and the pod 12 is loaded into or unloaded from the substrate processing apparatus 1 via the I/O port 14. Further, the storage chamber 13 includes a load port 16 such as a FIMS (Front-opening Interface Mechanical Standard) connected to the front surface of the delivery chamber 11 and configured to open or close the pod 12. The wafer 8 taken out from the pod 12 is handled in the delivery chamber 11 and the transfer chambers 5A and 5B constituting a mini-environment.

At the boundary wall (adjacent surface) between the transfer chambers 5A and 5B and the delivery chamber 11, there are installed a first gate valve 15A (gate valve 15A) and a second gate valve 15B (gate valve 15B) configured to load the wafer W between the transfer chambers 5A and 5B and the delivery chamber 11. Pressure detectors are installed in the delivery chamber 11 and the transfer chambers 5A and 5B, respectively, and a pressure in the delivery chamber 11 is set to be lower than pressures in the transfer chambers 5A and 5B. Further, oxygen concentration detectors are installed in the delivery chamber 11 and the transfer chambers 5A and 5B, respectively, and oxygen concentrations in the delivery chamber 11 and the transfer chambers 5A and 5B are kept lower than an oxygen concentration in the atmosphere. A clean unit 17 configured to supply a clean air into the delivery chamber 11 is installed at a ceiling of the delivery chamber 11, and is configured to circulate, for example, an inert gas as clean air in the delivery chamber 11. By circulating the inert gas and performing a purge in the transfer chamber 11 with the inert gas, the inside of the delivery chamber 11 may be made into a clean atmosphere. With such a configuration, it is possible to prevent particles and the like in the transfer chambers 5A and 5B from being mixed into the delivery chamber 11, and therefore it is possible to prevent a natural oxide film from being formed on the wafer 8 in the delivery chamber 11 and the transfer chambers 5A and 5B.

Since the processing module 2A and the processing module 2B include substantially the same (plane-symmetrical) configuration except for details, the first processing module 2A will be described below as a representative.

Figure 4:
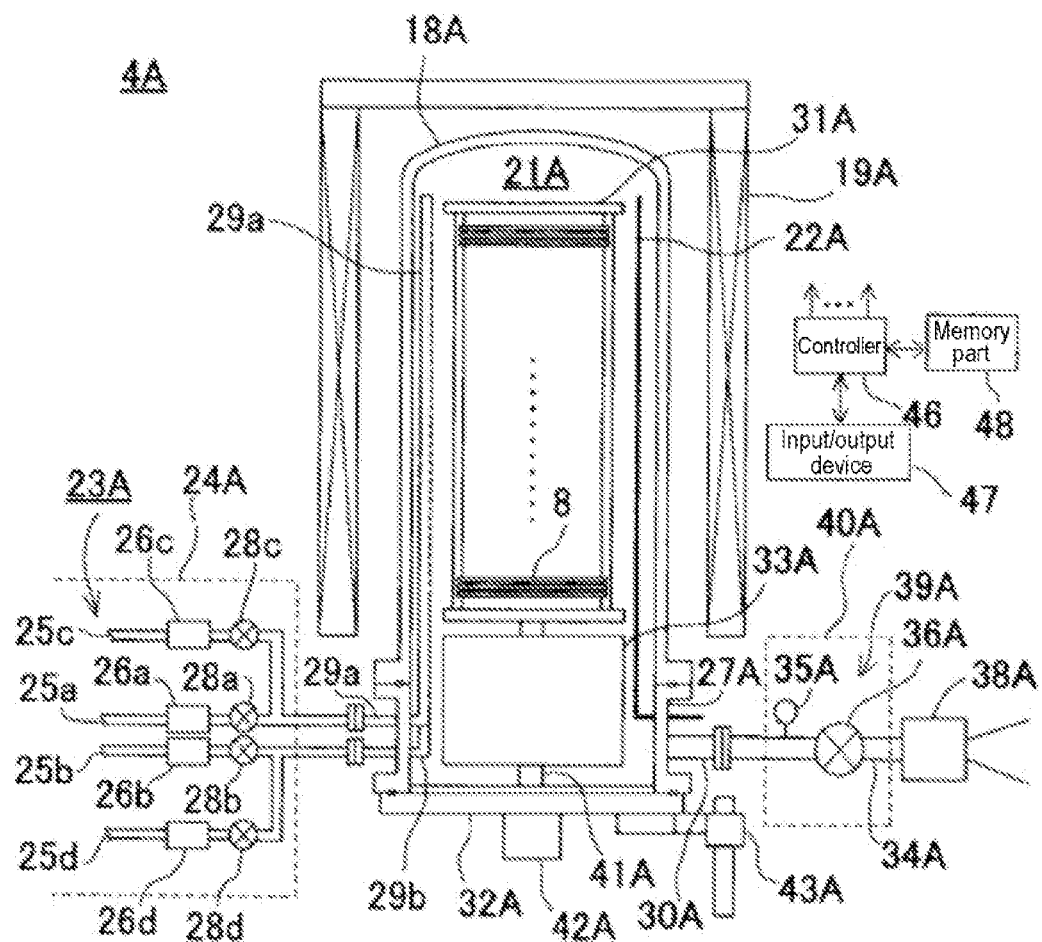
FIG. 4 is a vertical cross-sectional view showing an example of a process furnace according to embodiments of the present disclosure.

As shown in FIG. 4, the process furnace 4A includes a cylindrical first process container 18A (reaction tube 18A) and a first heater 19A (heater 19A) as a heating means (heating mechanism) installed on an outer periphery of the reaction tube 18A. The reaction tube 18A is formed of, for example, quartz (Si) or silicon carbide (SiC). Inside the reaction tube 18A, there is formed a first process chamber 21A (process chamber 21A) configured to process the wafer 8 as a substrate. Further, in the reaction tube 18A, a first temperature detection part 22A as a temperature detector is erected along an inner wall of the reaction tube 18A.

A gas used to process the substrate is supplied into the process chamber 21A by a first gas supply mechanism 23A as a gas supply system. The gas supplied by the gas supply mechanism 23A may be changed according to a type of the film to be formed. In the embodiments, the gas supply mechanism 23A includes a precursor gas supply part, a reaction gas supply part, and an inert gas supply part. The gas supply mechanism 23A is accommodated in a first supply box 24A (gas box) to be described below.

The precursor gas supply part includes a gas supply pipe 25a. At the gas supply pipe 25a, a mass flow controller (MFC) 26a, which is a flow rate controller (flow rate control part), and a valve 28a, which is an on-off valve, are installed sequentially from the upstream side. The gas supply pipe 25a is connected to a nozzle 29a that penetrates a side wall of a first manifold 27A (manifold 27A). The nozzle 29a is erected in the reaction tube 18A along a vertical direction. The nozzle 29a includes a plurality of supply holes opened toward the wafers 8 held by a first boat 31A (boat 31A). A precursor gas is supplied to the wafers 8 via the supply holes of the nozzle 29a.

Hereinafter, by virtue of the same configuration, a reaction gas is supplied to the wafers 8 from the reaction gas supply part via a gas supply pipe 25b, an MFC 26b, a valve 28b, and a nozzle 29b. An inert gas is supplied from the inert gas supply part to the wafers 8 via gas supply pipes 25c and 25d, MFCs 26c and 26d, valves 28c and 28d, and nozzles 29a and 29b.

A cylindrical manifold 27A is connected to a lower end opening of the reaction tube 18A via a seal such as an O-ring to support a lower end of the reaction tube 18A. The lower end opening of the manifold 27A is disposed to correspond to the ceiling of the transfer chamber 5A, and is opened or closed by a disk-shaped first lid 32A (lid 32A). A seal such as an O-ring is installed on an upper surface of the lid 32A, whereby the reaction tube 18A is airtightly sealed against the outside air. A first heat insulating portion 33A (heat insulating portion 33A) is placed on the lid 32A.

At the manifold 27A, a first exhaust port 30A (exhaust port 30A) is formed to extend in a direction orthogonal to an axis, that is, a direction orthogonal to a pipe axis of the reaction tube 18A, and a first exhaust pipe 34A is installed via the exhaust port 30A. A first booster pump 38A as a vacuum-exhauster is connected to the exhaust pipe 34A via a first pressure sensor 35A (pressure sensor 35A) as a pressure detector (pressure detection part) configured to detect the pressure in the process chamber 21A and a first conductance variable valve 36A as a pressure regulator (pressure regulation part). The conductance variable valve 36A is a two-stage valve configured by connecting two valves, that is, an APC (Auto Pressure Controller) valve and a gate valve, in series. Further, the APC valve is configured as a butterfly valve that may be opened with a flow path cross-sectional area equal to or larger than a cross-sectional area of the exhaust pipe 34A. With such a configuration, the pressure in the process chamber 21A may be set to a processing pressure according to the processing. An exhaust system 39A as a first exhaust system mainly includes the exhaust pipe 34A, the pressure sensor 35A and the conductance variable valve 36A. The exhaust system 39A may be accommodated in a first exhaust box 40A (exhaust box 40A) to be described below.

The process chamber 21A is configured to accommodate therein a boat 31A as a substrate holder that vertically supports a plurality of wafers 8, for example, 10 to 150 wafers 8, in a shelf shape. The boat 31A is supported above the heat insulating portion 33A by a first rotating shaft 41A (rotating shaft 41A) that penetrates the lid 32A and the heat insulating portion 33A. The rotating shaft 41A is connected to a first rotating mechanism 42A (rotating mechanism 42A) installed below the lid 32A, and the rotating shaft 41A is configured to be rotatable with the inside of the reaction tube 18A airtightly sealed. The lid 32A is driven in the vertical direction by a first boat elevator 43A (boat elevator 43A) as an elevating mechanism. As a result, the boat 31A and the lid 32A are integrally raised or lowered such that the boat 31A is loaded into or unloaded from the reaction tube 18A.

Figure 3:
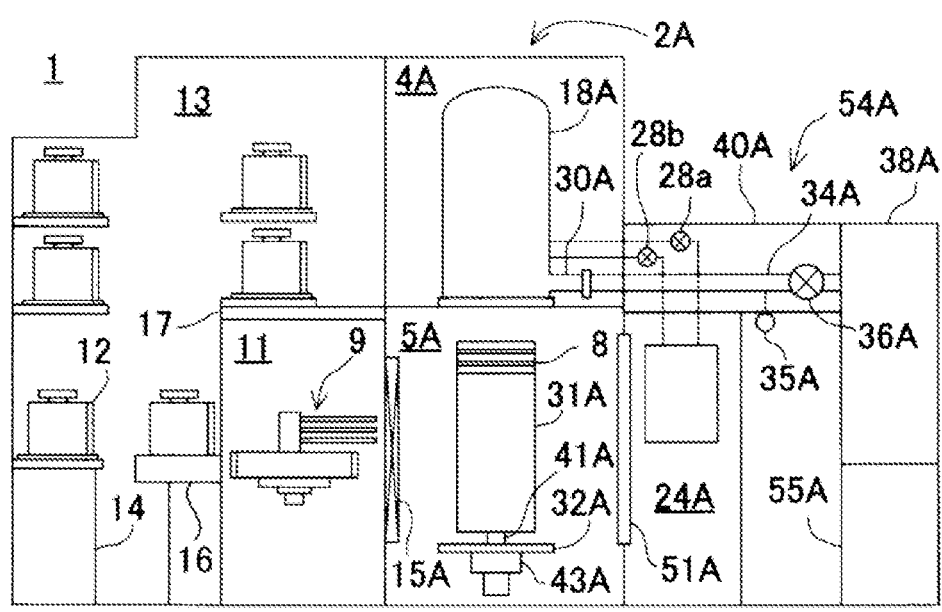
FIG. 3 is a horizontal cross-sectional view showing an example of a substrate processing apparatus according to embodiments of the present disclosure.

The delivery of the wafer 8 to the boat 31A is performed in the transfer chamber 5A. As shown in FIG. 3, a first clean unit 44A (clean unit 44A) is installed at one side surface of the transfer chamber 5A (at an outer side surface of the transfer chamber 5A, that is, a side surface opposite to a side surface facing the transfer chamber 5B). The clean unit 44A is configured to circulate a clean air (for example, an inert gas) in the transfer chamber 5A. The inert gas supplied into the transfer chamber 5A is exhausted from the inside of the transfer chamber 5A by a first exhaust part 45A (exhaust part 45A) installed at the side surface facing the clean unit 44A with the boat 31A interposed therebetween (at the side surface facing the transfer chamber 5B), and is resupplied from the clean unit 44A into the transfer chamber 5A (circulation purge). The pressure in the transfer chamber 5A is set to be always lower than the pressure in the delivery chamber 11. As a result, it is possible to prevent contamination from spreading as particles or contamination sources in the transfer chamber 5A are brought into the transfer chamber 11. Further, the oxygen concentration in the transfer chamber 5A is set to be lower than the oxygen concentration in the atmosphere.

A controller 46 configured to control the rotating mechanism 42A, the boat elevator 43A, the MFCs 38a to 38d of the gas supply mechanism 23A, the valves 28a to 28d, and the conductance variable valve 36A is connected thereto. The controller 46 includes, for example, a microprocessor (computer) including a CPU, and is configured to control the operations of the processing modules 2A and 2B. An input/output device 47 configured as, for example, a touch panel is connected to the controller 46. One controller 46 may be installed at each of the processing module 2A and the processing module 2B, or one controller 46 may be installed in common.

A memory part 48 as a storage medium is connected to the controller 46. A control program that controls an operation of the substrate processing apparatus 1 or a program (also referred to as a recipe) that causes each component of the substrate processing apparatus 1 to execute processing according to processing conditions is readably stored in the memory part 48.

The memory part 48 may be a memory device (a hard disk or a flash memory) built in the controller 46, or may be a portable external memory device (a magnetic tape, a magnetic disk such as a flexible disk or a hard disk, an optical disk such as a CD or a DVD, a magneto-optical disk such as an MO, or a semiconductor memory such as a USB memory or a memory card). Further, the program may be provided to the computer by using a communication means such as a dedicated line of the Internet. The program is read from the memory part 48 by an instruction from the input/output device 47 or the like, and the controller 46 executes a process according to the read recipe, such that the substrate processing apparatus 1 performs a desired process under the control of the controller 46. The controller 46 is accommodated in a control box (not shown) installed at an arbitrary location in the substrate processing apparatus 1.

Next, a rear surface configuration of the substrate processing apparatus 1 will be described.

As shown in FIG. 1, a first maintenance port 51A and a second maintenance port 51B (maintenance ports 51A and 51B) are formed on the rear surface side of the transfer chambers 5A and 5B, respectively. The maintenance port 51A is formed closer to the transfer chamber 5B, and has a width and a height such that the reaction tube 18A and the boat 31A may be loaded or unloaded via the maintenance port 51A. The maintenance port 51B is formed closer to the transfer chamber 5A, and has a width and a height such that the reaction tube 18B and the boat 31B may be loaded or unloaded via the maintenance port 51B. The maintenance ports 51A and 51B are opened or closed by a first maintenance door 52A (maintenance door 52A) and a second maintenance door 52B (maintenance door 52B). The maintenance doors 52A and 52B are configured to be rotatable around a first hinge 53A (hinge 53A) and a second hinge 53B (hinge 53B). The hinge 53A is installed at in the transfer chamber 5A near the transfer chamber 5B, and the hinge 53B is installed at the transfer chamber 5B near the transfer chamber 5A side. That is, the hinge 53A and the hinge 53B are installed to be adjacent to each other in the vicinity of inner corners located on adjacent surfaces on the rear surface sides of the transfer chamber 5A and the transfer chamber 5B. Thus, maintenance areas in which maintenance of the transfer chamber, the process furnace, and the like is performed are formed at the rear surface of the processing module 2A near the processing module 2B and at the rear surface of the processing module 2B near the processing module 2A.

The maintenance ports 51A and 51B are opened by horizontally rotating the maintenance doors 52A and 52B around the hinges 53A and 53B to the rear of the rear side of the transfer chambers 5A and 5B. The maintenance doors 52A and 52B are configured to be rotatable by 90 degrees or more, more specifically about 180 degrees. By rotating the maintenance doors 52A and 52B by about 180 degrees, one of the maintenance doors 52A and 52B overlaps with the other when opened, and does not interfere with the maintenance work.

A first utility system 54A (utility system 54A) and a second utility system 54B (utility system 54B) extending rearward are installed close to the rear surfaces of the processing modules 2A and 2B. The utility systems 54A and 54B are arranged plane-symmetrically with respect to each other with the maintenance areas interposed therebetween. The maintenance of the utility systems 54A and 54B is performed starting from the inside of the utility systems 54A and 54B, that is, from a space (maintenance area) between the utility systems 54A and 54B. The utility systems 54A and 54B include supply boxes 24A and 24B, exhaust boxes 40A and 40B, and booster pumps 38A and 38B. The maintenance ports of the respective boxes of the utility systems 54A and 54B are formed on the inner side (maintenance area side). That is, the maintenance ports of the respective boxes of the utility systems 54A and 54B are formed to face each other.

Since the utility systems 54A and 54B have substantially the same configuration except for details, the utility system 54A will be described below as a representative. The supply box 24A is arranged adjacent to the outer side portion of the rear surface of the transfer chamber 5A. The exhaust box 40A is disposed adjacent to the outer side portion of the rear surface of the process furnace 4A. That is, outer side surfaces of the supply box 24A and the exhaust box 40A are positioned flatly (smoothly) to be substantially continuously connected to the outer side surfaces of the transfer chamber 5A. Further, the supply box 24A and the exhaust box 40A are adjacent to each other in the vertical direction. The rear surfaces of the supply box 24A and the exhaust box 40A are substantially coplanar.

The booster pump 38A is arranged adjacent to the rear surfaces of the supply box 24A and the exhaust box 40A. The booster pump 38A is accommodated in a housing (frame) having a substantially rectangular parallelepiped contour, and may be installed on a first gantry 55A (gantry 55A) having a predetermined height. The gantry 55A includes four swivel casters 64A on a bottom surface thereof and is configured to be movable on the floor. During operation, the gantry 55A is bolted to the floor surface, and the booster pump 38A is bolted to the gantry 55A. The same applies to the booster pump 38B.

The booster pump 38A and the gantry 55A include an installation area (footprint) of less than 500×500 mm$^2$ in a stacked state, while the height thereof may reach 2500 mm. In the example shown in FIG. 7A, the installation area is set to 450×450 mm$^2$, and a width thereof is substantially equal to the maximum width of the utility system 54A. Further, outer side surfaces of the booster pumps 38A and 38B are arranged such that the outer side surfaces of the booster pumps 38A and 38B do not protrude outward from outer side surfaces of the utility systems 54A and 54B, that is, the outer side surfaces of the exhaust boxes 40A and 40B and the outer side surfaces of the supply boxes 24A and 24B. The heights of the gantries 55A and 55B may be changed. Further, the gantries 55A and 55B may be provided with measures (vibration countermeasures) to absorb vibrations from the booster pumps 38A and 38B and vibrations such as an earthquake.

Figure 5:
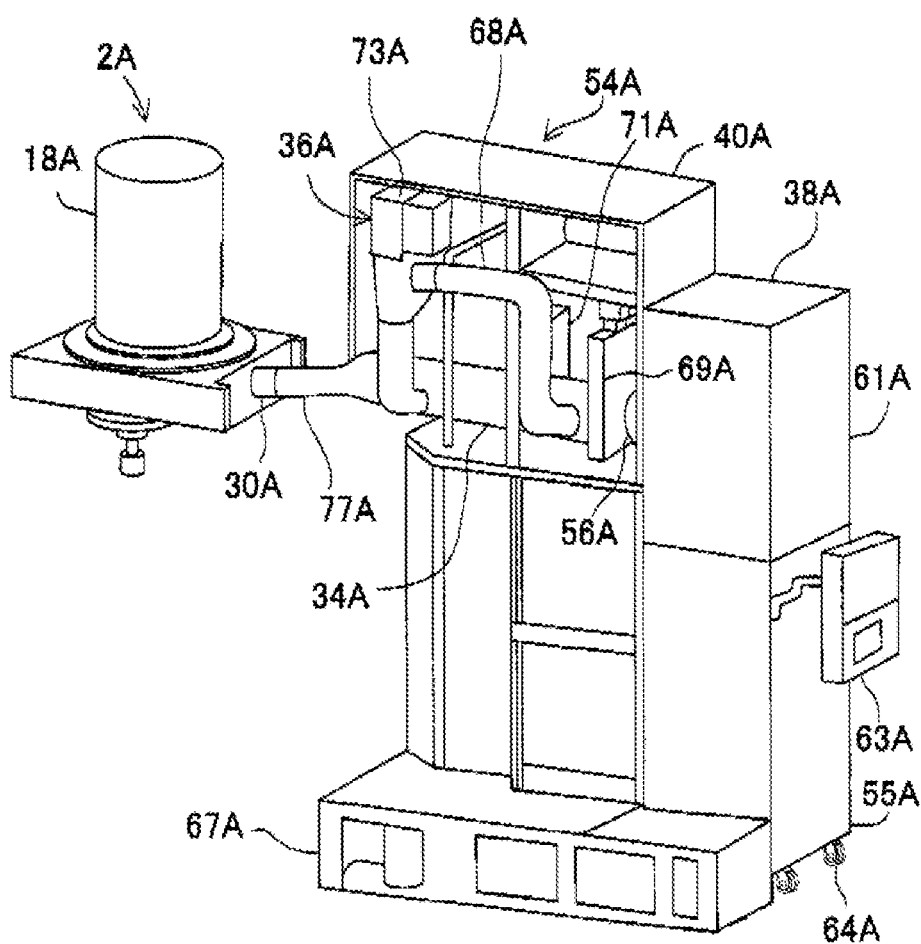
FIG. 5 is a perspective view showing an example of a utility system according to embodiments of the present disclosure.

As recognized from FIGS. 1, 3 and 5, a thickness of the supply box 24A (a lateral width when viewed from the front of the substrate processing apparatus 1) spreads stepwise from the front side to the rear side. The maximum width of the supply box 24A is less than or equal to a thickness of the exhaust box 40A. On the other hand, the thickness of the exhaust box 40A is constant from the front side to the rear side. The exhaust box 40A has a rectangular parallelepiped outer shape, and the exhaust pipe 34A horizontally penetrates the exhaust box 40A in the front-rear direction. In other words, the exhaust boxes 40A and 40B protrude toward the maintenance areas more than the supply boxes 24A and 24B. By installing the wide exhaust box 40A substantially above the transfer chamber 5A, it is possible to secure a large lateral width of the maintenance area behind the maintenance door 52A of the transfer chamber 5A. That is, since a distance to the supply boxes 24A and 24B is larger than a distance to the exhaust boxes 40A and 40B in the top view, a maintenance area having a width large enough to take out the reaction tube 18A from the open maintenance door 52A is secured. A floor box 67A is installed on a floor of the entire maintenance area to accommodate an exhaust duct, cooling water, an electric cable, and the like. An upper surface of the floor box 67A is flat and lower than a lower end of the maintenance door. The floor box 67A may include one or more hard points that serve as fulcrums during maintenance of heavy objects.

As shown in FIGS. 3 and 5, the supply box 24A accommodates most of the first gas supply mechanism 23A below the exhaust box 40A. The gas supply pipes 25a and 25b extend to the outside of the supply box 24A, and pass between the exhaust box 40A and the exhaust pipe 34A. The gas supply pipes 25a and 25b are connected to the valves 28a and 28b arranged in the exhaust box 40A. Further, front portions of the gas supply pipes 25a and 25b extend to the nozzles 29a and 29b. In another configuration, the gas supply mechanism 23A may have a height such that the gas supply mechanism 23A may accommodate the valves 28a and 28b, and a recess may be formed on the inner side surface of the gas supply mechanism 23A to avoid interference with the exhaust box 40A (exhaust pipe 34A). Alternatively, the exhaust box 40A may be abolished, and the exhaust pipe 34A may be disposed to penetrate the supply box 24A and the exhaust box 40A. Even in that case, the exhaust pipe 34A is arranged closer to the outside at a height to avoid the maintenance door 52A. In FIG. 5, the exhaust pipe 34A is installed above the maintenance door 52A. However, the exhaust pipe 34A may be installed below the maintenance door 52A.

In this regard, the exhaust port 30A facing rearward and the first intake port 56A formed in the booster pump 38B to face forward may face each other or substantially face each other. Further, the heights of the exhaust port 30A and the intake port 56A are the same or substantially the same. Therefore, the exhaust pipe 34A penetrates the inside of the utility system 54A substantially linearly and substantially horizontally to connect the exhaust port 30A and the first intake port 56A. When extension axes of the exhaust port 30A and the first intake port 56A are offset, the exhaust pipe 34A may be bent gently. In the embodiments, the exhaust pipe 34A is configured by sequentially connecting a gentle curve section in which the exhaust pipe 34A slightly extends directly behind the exhaust port 30A having a nominal diameter of about 100 mm and then faces the outside of the substrate processing apparatus 1, a tapered section in which the nominal diameter increases from 100 mm to 200 mm, a gentle curve section in which the exhaust pipe 34A faces the inside of the substrate processing apparatus 1, and a straight pipe section in which the exhaust pipe 34A coincides with an extension axis of the intake port 56A. At the straight pipe section, an APC valve corresponding to the nominal diameter of 200 mm, a shutoff gate valve, a maintenance gate valve, a bellows configured to isolate the exhaust pipe 34A from the vibration of the booster pump 38A, and an adapter configured to allow a detachable connection to the first intake port 56A are arranged sequentially from the upstream side to the downstream side. By disposing the exhaust pipe 34 substantially horizontally in this way, a pipe length of the exhaust pipe 34 may be shortened and, therefore, a conductance may be improved. The exhaust box 40A in the embodiments is formed to have a height larger than a lateral width to accommodate a longitudinally long gate valve. The exhaust box 40A accommodates only the straight pipe section of the exhaust pipe 34A. That is, there is a gap between the process furnace 4A and the exhaust box 40A, and a portion between the exhaust port 30A and the straight pipe section of the exhaust pipe 34A may be exposed.

Figure 6:
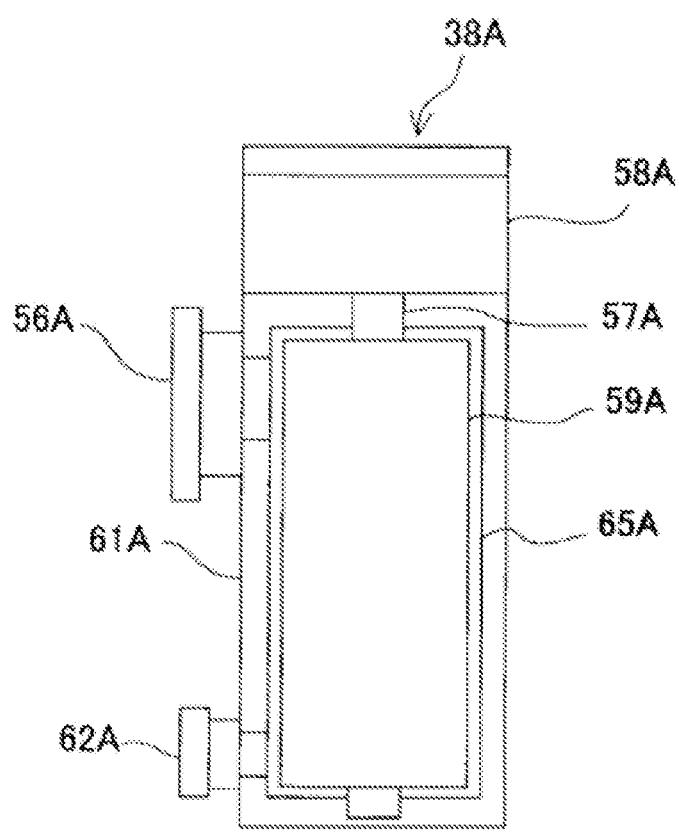
FIG. 6 is a vertical cross-sectional view showing an example of a booster pump according to embodiments of the present disclosure.

Next, the booster pump 38A will be further described with reference to FIGS. 6, 7A, and 7B. The booster pump 38A according to the embodiments is configured to be installed longitudinally. By installing the booster pump 38A longitudinally, the footprint (installation area) is reduced.

The booster pump 38A includes a main body (casing) 61A including a space (rotor chamber) therein, one or more rotors 59A configured to rotate in the main body 61A, an intake port 56A connected to the exhaust pipe 34A and installed at an upper side surface of the main body 61A, a first exhaust port 62A installed at a lower portion of a side surface of the main body 61A and configured to exhaust a gas, a motor 58A configured to rotate a rotating shaft 57A of the rotor 59A, a first pump controller 63A configured to drive the motor 58A and control variably the rotation speed, and an ancillary facility (not shown) configured to supply a ballast gas, cooling water, and the like. The pump controller 63A or the ancillary facility may be installed in, for example, a gantry 55A, and an operation part or a display part thereof may be installed at the side surface thereof.

Further, a first gas flow path 65A (gas flow path 65A) is formed by the inside of the intake port 56A, the inside of the exhaust port 62A, and an intermediate chamber moving between the main body 61A and the rotor 59A. Moreover, the gas introduced from the intake port 56A is allowed to flow through the gas flow path 65A and is discharged from the exhaust port 62A. The intake port 56A is opened orthogonally to the rotating shaft 57A to directly face the rotor chamber. The exhaust port 62A is opened on the same or opposite side surface as the intake port 56A, and is connected to an intake port of an auxiliary vacuum-exhauster (not shown) such as a rotary pump or the like.

Since the rotating shaft 57A is disposed to extend in the vertical direction, the main body 61A is longitudinally long. The main body 61A is made of cast iron and has a large weight. By installing the motor 58A at the main body 61A, a center of gravity of the booster pump 38A may be lowered as much as possible, and the booster pump 38A may be stably installed.

The rotor 59A driven by the rotating shaft 57A is a two-stage root type including a plurality of rotors, for example, two rotors. The gas sucked from the intake port 56A via the exhaust pipe 34A is introduced into the exhaust port 62A while rotating in the gas flow path 65A together with the rotation of the rotor 59A. In this regard, the intake port 56A is installed on the upper side surface of the main body 61A, and the exhaust port 30A and the intake port 56A have the same or substantially the same height. Therefore, since a shape of the exhaust pipe 34A may be made linear and may be arranged horizontally, a distance between the exhaust port 30A and the intake port 56A may be minimized, and an exhaust capacity of the booster pump 38A may be maximized. On the other hand, by installing the exhaust port 62A at the lower portion of the main body 61A, it is possible to, for example, shorten a routing of the pipe to the main pump installed at the lower floor. When the exhaust port 30A and the exhaust port 62A have the same height or substantially the same height, the exhaust port 62A may be used as the intake port, and the intake port 56A may be used as the exhaust port.

Further, a gate valve may be installed at the intake port 56A. As a result, the atmosphere inside the exhaust pipe 34A is opened during maintenance. The intake port 56A may be closed even when a highly dangerous gas such as HCl is emitted due to a reaction with an ambient air and moisture depending on the film type. Therefore, it is possible to prevent a danger during maintenance.

Further, since the booster pump 38A is installed on the gantry 55A, the height of the intake port 56A may be regulated to be equal to the height of the exhaust port 30A by appropriately selecting the gantry 55A having a different height or by regulating the height of the gantry 55A.

Next, a process (film-forming process) of forming a film on a substrate by using the above-described substrate processing apparatus 1 will be described. An example in which a film is formed on the wafer 8 by supplying a gas A as a precursor gas and a gas B as a reaction gas to the wafer 8 will be described here. In the following description, operations of the respective components constituting the substrate processing apparatus 1 is controlled by the controller 46.

(Wafer Charging and Boat Loading)

The gate valve 15A is opened, and the wafer 8 is transferred to the boat 31A. When a plurality of wafers 8 is charged into the boat 31A (wafer charging), the gate valve 15A is closed. The boat 31A is loaded into the process chamber 21A by the boat elevator 43A (boat loading), and the lower opening of the reaction tube 18A is hermetically closed (sealed) by the lid 32A.

(Pressure Regulation and Temperature Regulation)

Vacuum-exhaustion (decompression exhaustion) is performed by the booster pump 38A such that the process chamber 21A has a predetermined pressure (vacuum degree). The atmosphere in the process chamber 21A is circulated linearly or substantially linearly in the exhaust pipe 34, and is exhausted via the inside of the booster pump 38A. The pressure in the process chamber 21A is measured by a pressure sensor 35A, and the conductance variable valve 36A is feedback-controlled based on the measured pressure information. Further, the wafers 8 in the process chamber 21A are heated by the heater 19A to have a predetermined temperature. At this time, a supply of electric power to the heater 19A is feedback-controlled based on the temperature information detected by the temperature detection part 22A such that the process chamber 21A has a predetermined temperature distribution. Further, the rotating mechanism 42A starts the rotation of the boat 31A and the wafers 8.

(Film-Forming Process)

[Precursor Gas Supply Step]

When the temperature in the process chamber 21A is stabilized at a preset processing temperature, the gas A is supplied to the wafers 8 in the process chamber 21A. The gas A is controlled by the MFC 26a to have a desired flow rate, and is supplied into the process chamber 21A via the gas supply pipe 25a and the nozzle 29a.

[Precursor Gas Exhaust Step]

Subsequently, the supply of the gas A is stopped, and the inside of the process chamber 21A is vacuum-exhausted by the booster pump 38A. The gas A in the process chamber 21A is circulated linearly or substantially linearly in the exhaust pipe 34A, and is exhausted via the booster pump 38A. At this time, a $N_2$ gas as an inert gas may be supplied into the process chamber 21A from the inert gas supply part (inert gas purge).

[Reaction Gas Supply Step]

Next, the gas B is supplied to the wafers 8 in the process chamber 21A. The gas B is controlled by the MFC 26b to have a desired flow rate, and is supplied into the process chamber 21A via the gas supply pipe 25b and the nozzle 29b.

[Reaction Gas Exhaust Step]

Subsequently, the supply of the gas B is stopped, and the inside of the process chamber 21A is vacuum-exhausted by the booster pump 38A. The gas B in the process chamber 21A is circulated linearly or substantially linearly in the exhaust pipe 34A, and is exhausted via the booster pump 38A. At this time, a $N_2$ gas as an inert gas may be supplied into the process chamber 21A from the inert gas supply part (inert gas purge).

By performing a cycle including the above-described four steps a predetermined number of times (one or more times), a film having a predetermined composition and a predetermined film thickness can be formed on the wafer 8.

(Boat Unloading and Wafer Discharging)

After forming a film having a predetermined film thickness, a $N_2$ gas is supplied from the inert gas supply part, the atmosphere in the process chamber 21A is replaced with the $N_2$ gas, and the pressure in the process chamber 21A is restored to an atmospheric pressure. Thereafter, the lid 32A is lowered by the boat elevator 43A, and the boat 31A is unloaded from the reaction tube 18A (boat unloading). Thereafter, the processed wafers 8 are taken out from the boat 31A (wafer discharging).

Thereafter, the wafers 8 may be stored in the pod 12 and carried out of the substrate processing apparatus 1. Alternatively, the wafers 8 may be stored in the pod 12 and transferred to the process furnace 4B and a substrate processing process such as annealing may be performed on the wafers 8 continuously. When the wafers 8 are processed in the process furnace 4B continuously after processing the wafers 8 in the process furnace 4A, the gate valve 15A and the second gate valve 15B are opened, and the wafers 8 are directly conveyed from the boat 31A to a second boat 31B (boat 31B). Subsequent loading or unloading of the wafers 8 into or out of the process furnace 4B is performed in the same procedure as the substrate processing process performed by the process furnace 4A described above. Further, the substrate processing process in the process furnace 4B is performed by the same procedure as the substrate processing process in the process furnace 4A described above, for example.

Examples of processing conditions when a silicon film or a silicon compound film is formed on the wafer 8 by using a silicon-containing gas as the gas A or the gas B are as follows.

Processing temperature (wafer temperature): 300 degrees C. to 700 degrees C.

Processing pressure (pressure in process chamber): 1 Pa to 4000 Pa

Further, the processing modules 2A and 2B may be configured to form different films such as a film A and a film B. In that case, the configurations of the gas supply mechanisms 23A and 23B are also different. However, the symmetry of the supply boxes 24A and 24B or the exhaust boxes 40A and 40B is maintained.

Next, the maintenance of the substrate processing apparatus 1 will be described. An interlock is set such that the maintenance door 52A cannot be opened when the inside of the transfer chamber 5A is circulation-purged with an inert gas. An interlock is set such that the maintenance door 52A cannot be opened even when an oxygen concentration in the transfer chamber 5A is lower than an oxygen concentration in the atmosphere. The same applies to the maintenance door 52B. Further, an interlock is set such that the gate valves 15A and 15B cannot be opened when the maintenance doors 52A and 52B are opened. When the gate valves 15A and 15B are opened with the maintenance doors 52A and 52B kept open, the entire substrate processing apparatus 1 is set to a maintenance mode, and then the separately installed maintenance switch is turned on. Thus, the interlock for the gate valves 15A and 15B is released, and the gate valves 15A and 15B may be opened.

When opening the maintenance door 52A, the ambient air is introduced from the clean unit 44A into the transfer chamber 5A to raise the oxygen concentration in the transfer chamber 5A to the oxygen concentration in the atmosphere or more, preferably to the oxygen concentration in the atmosphere. At this time, the circulation purge in the transfer chamber 5A is released such that the pressure in the transfer chamber 5A does not become higher than the pressure in the delivery chamber 11. The atmosphere in the transfer chamber 5A is exhausted to the outside of the transfer chamber 5A. A rotation speed of the fan of the clean unit 44A is made lower than a rotation speed at the time of circulation-purge to control an amount of the ambient air introduced into the transfer chamber 5A. By performing the control in this way, the pressure in the transfer chamber 5A may be maintained lower than the pressure in the delivery chamber 11 while increasing the oxygen concentration in the transfer chamber 5A.

When the oxygen concentration in the transfer chamber 5A becomes equal to the oxygen concentration in the atmosphere, the interlock is released and the maintenance door 52A may be opened. At this time, even in a case where the oxygen concentration in the transfer chamber 5A is equal to the oxygen concentration in the atmosphere, when the pressure in the transfer chamber 5A is higher than the pressure in the delivery chamber 11, the maintenance door 52A cannot be opened. When the maintenance door 52A is opened, the rotation speed of the fan of the clean unit 44A becomes larger than at least the rotation speed at the time of circulation purge. Specifically, the rotation speed of the fan of the clean unit 44A may be maximized in some embodiments.

After opening the maintenance door 52A, for example, a stage of a trolley is allowed to enter the transfer chamber 5A via the maintenance port 51A, and the reaction tube 18A and the boat 31A are carried in or out of the transfer chamber 5A via the trolley. At this time, the exhaust port 30A and the exhaust pipe 34A are located above the maintenance port 51A such that the exhaust port 30A and the exhaust pipe 34A do not to interfere with the trolley and the reaction tube 18A that are carried in or out.

The maintenance of the inside of the delivery chamber 11 is performed starting from the maintenance port 50 formed in front of the delivery chamber 11 and in the portion where a pod opener is not installed. The maintenance port 50 is configured to be opened or closed by a maintenance door (not shown). As described above, when the entire substrate processing apparatus 1 is set to the maintenance mode, the gate valves 15A and 15B may be opened and the maintenance may be performed at the side of the gate valves 15A and 15B. That is, the maintenance in the delivery chamber 11 may be performed starting from either the front of the apparatus or the back of the apparatus.

As described above, in the embodiments, the booster pumps 38A and 38B are installed at the positions adjacent to the exhaust boxes 40A and 40B to face or substantially face the exhaust ports 30A and 30B (not shown) and the intake ports 56A and 56B (not shown), respectively and to have the same height. Therefore, the linear exhaust pipes 34A and 34B (not shown) may be arranged horizontally, and the booster pumps 38A and 38B may be connected to the reaction tubes 18A and 18B at the shortest distance. Thus, the exhaust capacity of the booster pumps 38A and 38B may be maximized, the exhaust efficiency (exhaust speed) may be improved while suppressing a machine difference reduction and the COO may be reduced.

Further, since the linear exhaust pipes 34A and 34B are used, the gas exhausted from the reaction tubes 18A and 18B flows substantially linearly in fluid communication between the exhaust ports 30A and 30B and the intake ports 56A and 56B. Therefore, in the process of flowing through the exhaust pipes 34A and 34B, the exhaust gas does not suffer from a pressure loss, and the exhaust efficiency may be improved.

Further, the booster pumps 38A and 38B increase the exhaust speed in the pressure region (e.g., 1 Pa to 1 kPa) where the exhaust speed of the auxiliary vacuum-exhauster is reduced. When a positive displacement pump is used as the booster pump, an exhaust speed thereof is determined by a rotation speed of a rotor except near an ultimate vacuum degree. Therefore, a variation in exhaust speed is reduced as compared with the case where only the auxiliary vacuum-exhauster is used. As the booster pumps 38A and 38B, various mechanical booster pumps such as a rotary blade type (axial flow type), a screw type, and a scroll type may be used in addition to a root type. Further, a momentum transport type pump such as a turbo molecular pump and an ejector may also be used.

Further, the booster pumps 38A and 38B are configured to have an installation area which is less than 500×500 mm$^2$ when installed longitudinally, and are disposed such that the booster pumps 38A and 38B do not protrude outward from the outer side surfaces of the utility systems 54A and 54B. Therefore, the footprint of the substrate processing apparatus 1 may be reduced.

Further, the booster pumps 38A and 38B are installed on the gantries 55A and 55B. Therefore, the heights of the intake ports 56A and 56B may be regulated by appropriately selecting the gantries 55A and 55B having different heights or regulating the heights of the gantries 55A and 55B. Further, since the gantries 55A and 55B and the booster pumps 38A and 38B are fixed to the floor surface by a fixing tool such as a bolt, the booster pumps 38A and 38B may be prevented from tipping over.

Further, the maintenance area is installed at the rear surface of the substrate processing apparatus 1, and the maintenance of the utility systems 54A and 54B may be performed at the maintenance area. Therefore, maintenance areas may not be secured on both sides of the substrate processing apparatus 1, whereby the footprint of the substrate processing apparatus 1 may be reduced and an area used in a clean room may be suppressed.

Further, by installing the utility systems 54A and 54B of the processing modules 2A and 2B to face each other at both outer side surfaces of the substrate processing apparatus 1, the space on the rear surface of the substrate processing apparatus 1 may be used as a common maintenance area between the left and right processing modules 2A and 2B. For example, in the related art, a supply box and an exhaust box may be installed to face each other at both ends of a rear surface of an apparatus. When two apparatuses having such a configuration are disposed, the exhaust box at one side and the supply box at the other side are adjacent to each other at a boundary line between the two apparatuses. On the other hand, in the embodiments, the utility system is not disposed at the boundary line between the two processing modules 2A and 2B. Therefore, it is possible to secure a wide maintenance area.

Further, by including the gate valves 15A and 15B, it is possible to perform the maintenance in the processing modules 2A and 2B or the delivery chamber 11 at one side while performing the substrate processing process in the processing modules 2A and 2B at the other side. As a result, the maintenance may be performed without stopping the film-forming process. Therefore, it is possible to increase an operating rate of the substrate processing apparatus 1 and to improve a productivity.

Figure 8:
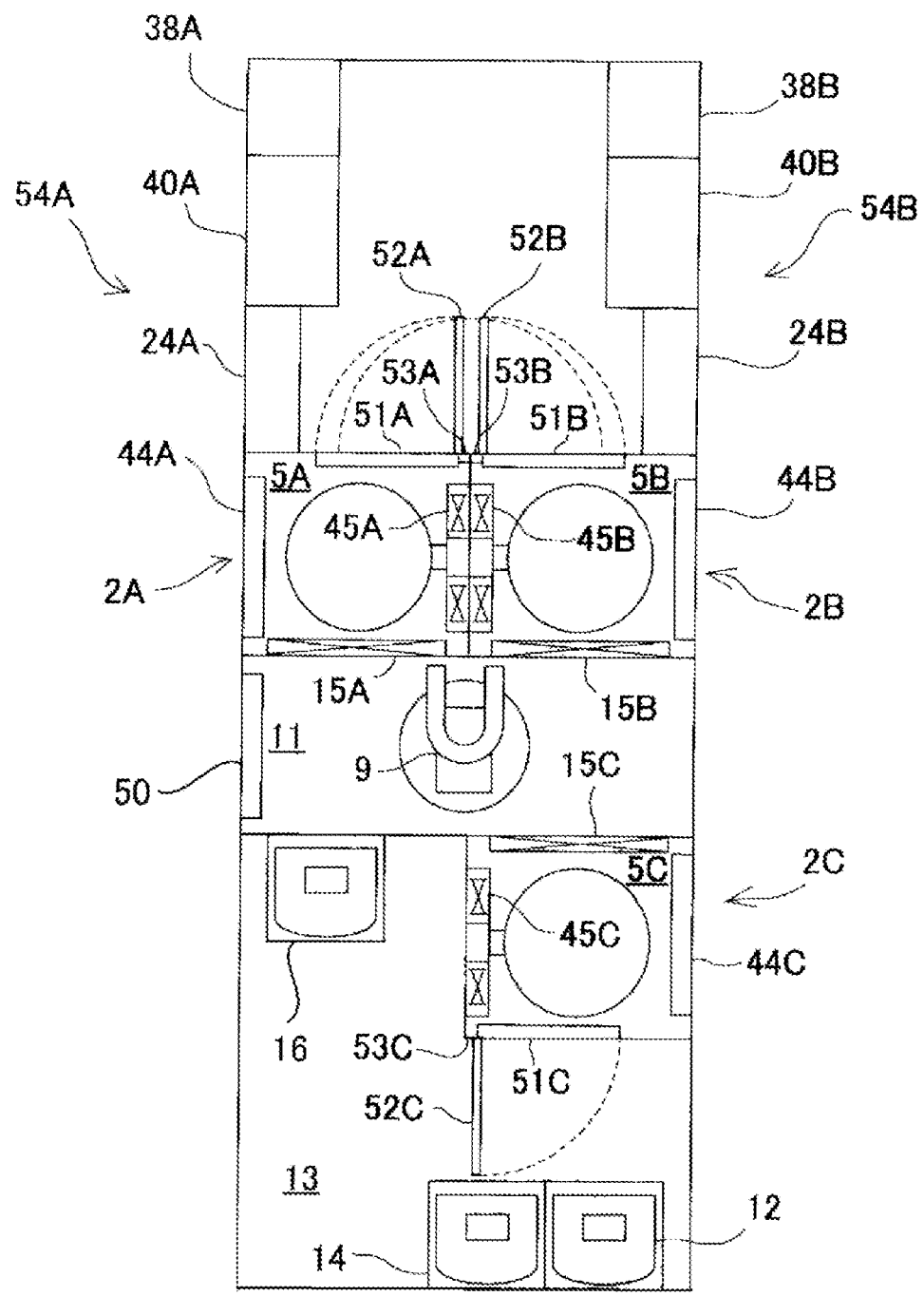
FIG. 8 is a top view showing a modification of a substrate processing apparatus according to embodiments of the present disclosure.

In the embodiments, the substrate processing apparatus 1 including two processing modules 2A and 2B has been described, but the number of processing modules may be one or three. FIG. 8 shows a substrate processing apparatus 1 including three processing modules 2A, 2B, and 2C. Although not shown, the processing module 2C also includes the same utility system as the processing modules 2A and 2B.

The processing module 2C is installed at a position symmetrical to the processing module 2B with respect to the delivery chamber 11. The processing module 2C and the delivery chamber 11 are in fluid communication with each other via a gate valve 15C. Further, the processing module 2C and the storage chamber 13 are in fluid communication with each other via a maintenance port 51C, and the maintenance port 51C may be hermetically closed by a maintenance door 52C.

In the substrate processing apparatus 1 including three processing modules 2A, 2B, and 2C, the storage chamber 13 is configured to become a maintenance area of the processing module 2C.

Figure 9:
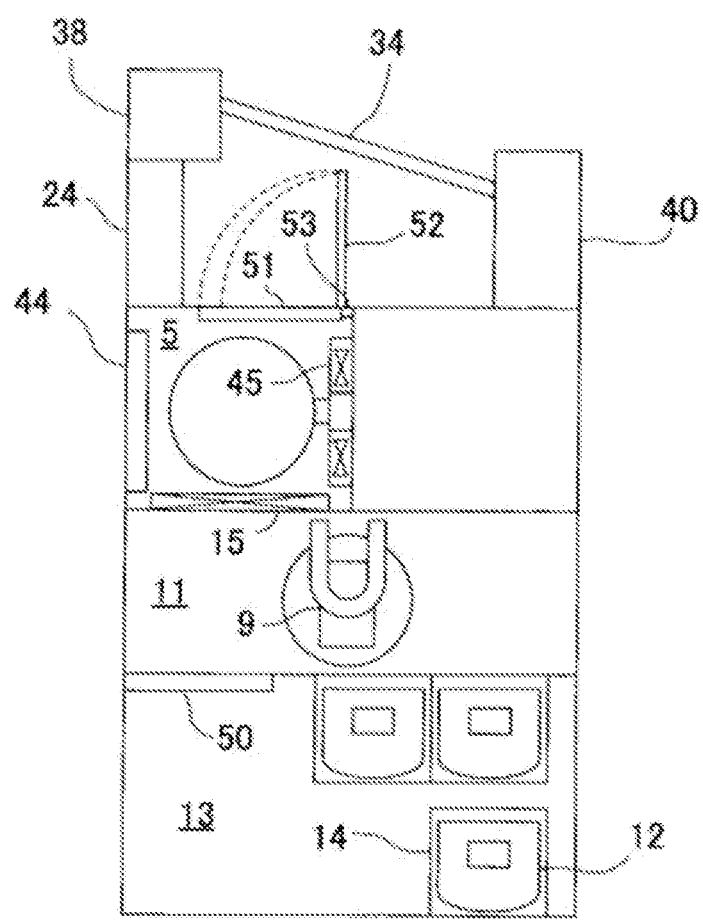
FIG. 9 is a top view showing a modification of a substrate processing apparatus according to embodiments of the present disclosure.

Further, FIG. 9 shows a substrate processing apparatus 1 including one processing module 2. In the case of this substrate processing apparatus 1, a supply box 24 as a first utility system is installed near the rear surface of the transfer chamber 5, and an exhaust box 40 as a second utility system is installed to face the supply box 24 with a maintenance area interposed therebetween. The maintenance ports of the supply box 24 and the exhaust box 40 are formed face each other.

The booster pump 38 is disposed adjacent to a side of the supply box 24 opposite to a side of the supply box 24 adjacent to the transfer chamber 5. The exhaust box 40 and the booster pump 38 are connected by a linear exhaust pipe 34 disposed horizontally in the air. In the case of the substrate processing apparatus 1 including one processing module 2, the intake port of the booster pump 38 does not face the exhaust port of the manifold, but is configured to have the same height as the exhaust port.

The embodiments of the present disclosure have been specifically described above. However, the present disclosure is not limited to the above-described embodiments, and various modifications may be made without departing from the gist of the present disclosure.

For example, in the above-described embodiments, there have been described the examples in which the silicon-containing gas is used as the precursor gas. However, the present disclosure is not limited to such embodiments. Examples of the silicon-containing gas may include an inorganic halosilane precursor gas such as a MCS ($SiH_3Cl$: monochlorosilane) gas, a DCS (dichlorosilane) gas, a TCS ($SiHCl_3$: trichlorosilane) gas, and a HCD ($Si_2Cl_6$: hexachlorodisilane) gas, a halogen-free amino-based (amine-based) silane precursor gas such as a 3DMAS ($Si[N(CH_3)_2]_3H$: trisdimethylaminosilane) gas, and a BTBAS ($SiH_2[NH(C_4H_9)]2$: bis-tertiary-butylaminosilane) gas, and a halogen-free inorganic silane precursor gas such as a MS ($SiH_4$: monosilane) gas and a DS ($Si_2H_6$: disilane) gas.

As the reaction gas, one or more gases selected from the group of an oxygen-containing gas (oxidizing gas) such as oxygen or an ozone gas, a nitrogen (N)-containing gas (nitriding gas) such as ammonia ($NH_3$) gas, a carbon (C)-containing gas such as a propylene ($C_3H_6$) gas, a boron (B)-containing gas such as a boron trichloride ($BCl_3$) gas, and the like may be used to form a SiN film, a SiON film, a SiOCN film, a SiOC film, a SiCN film, a SiBN film, a SiBCN film, or the like. Even when forming these films, the film formation may be performed under the same processing conditions as in the above-described embodiments, and the same effects as those in the above-described embodiments may be obtained.

Further, for example, the present disclosure may be suitably applied to a case where a film containing a metal element such as titanium (Ti), zirconium (Zr), hafnium (Hf), tantalum (Ta), niobium (Nb), aluminum (Al), molybdenum (Mo), and tungsten (W), that is, a metal-based film is formed on the wafer 8.

In the above-described embodiments, there has been described the examples where the film is deposited on the wafer 8. However, the present disclosure is not limited to such embodiments. For example, the present disclosure may be suitably applied to the case where the wafer 8 or the film formed on the wafer 8 is subjected to a process such as an oxidation process, a diffusion process, an annealing process, and an etching process.

Further, the above-described embodiments or modifications may be used in combination as appropriate. The processing conditions at this time may be, for example, the same processing conditions as those in the above-described embodiments or modifications.

Figure 10:
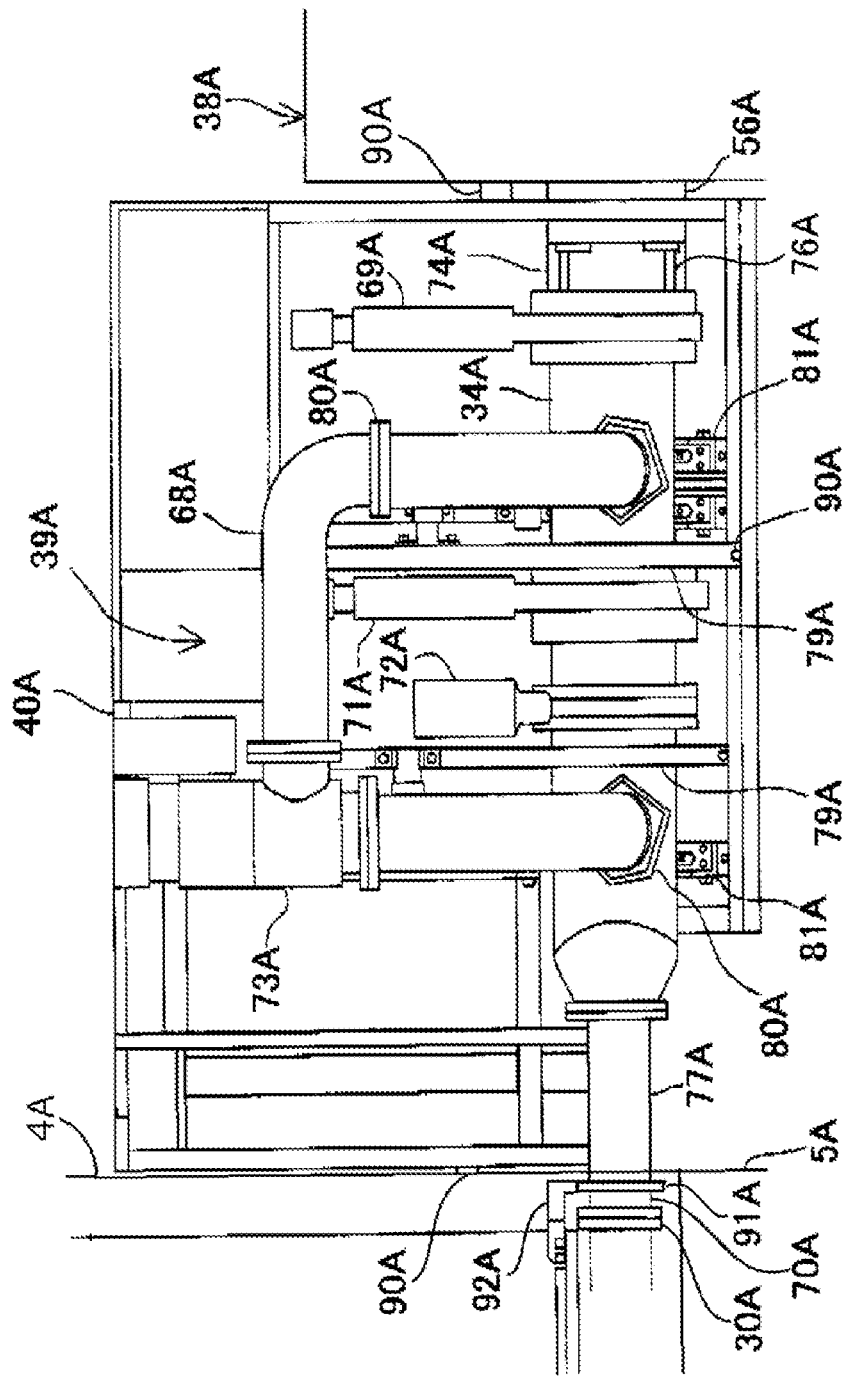
FIG. 10 is a front view showing an example of an exhaust system and a peripheral portion according to embodiments of the present disclosure.
Figure 11:
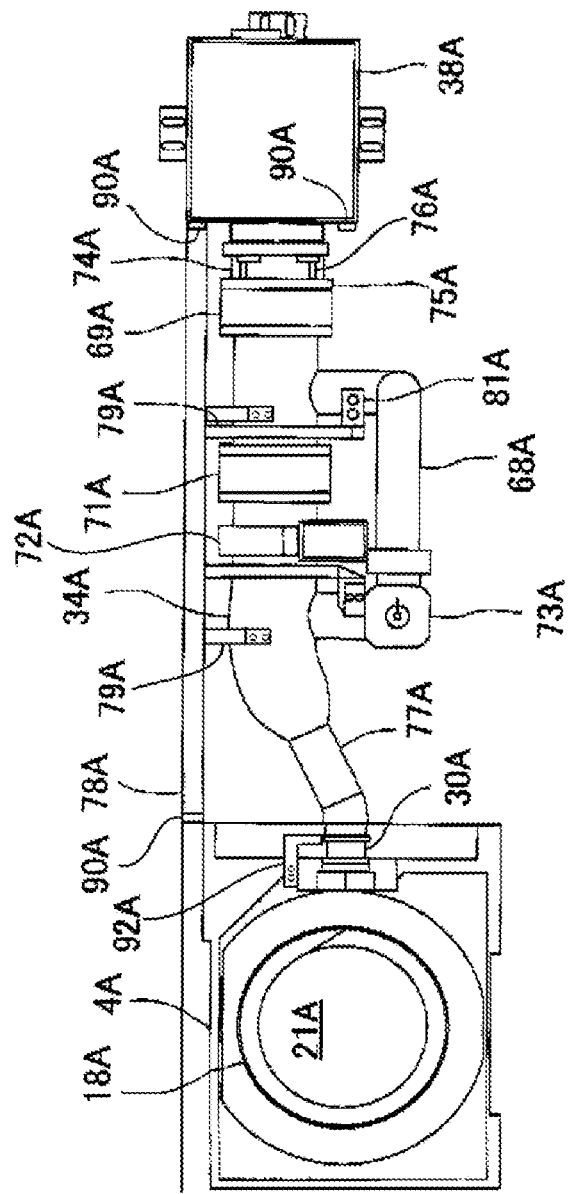
FIG. 11 is a plane view showing an example of an exhaust system and a peripheral portion according to embodiments of the present disclosure.

Next, details of peripheral parts of the booster pump 38A, the exhaust system 39A, and the process furnace 4A will be described with reference to FIGS. 10 and 11. Since the booster pump 38A and the booster pump 38B have the same configuration, the exhaust system 39A and the exhaust system 39B have the same configuration, and the process furnace 4A and the process furnace 4B have the same configuration, the booster pump 38A, the exhaust system 39A and the process furnace 4A will be described below. Description of the booster pump 38B, the exhaust system 39B, and the process furnace 4B will be omitted. Further, when a member A is described below, it is assumed that a member B having the same configuration also exists.

The exhaust box 40A as a pipe housing is disposed adjacent to the booster pump 38A, and the process furnace 4A is disposed adjacent to the exhaust box 40A. Further, the exhaust box 40A and the process furnace 4A are connected via the exhaust system 39A, and the exhaust system 39A is accommodated and supported in the exhaust box 40A.

The exhaust system 39A includes an exhaust pipe 34A, a branch exhaust pipe 68A, a first gate valve 69A, a second gate valve 71A, a first APC valve 72A, and a second APC valve 73A. Further, the first APC valve 72A and the second APC valve 73A constitute a conductance variable valve 36A.

One end of the exhaust pipe 34A is connected to the intake port 56A of the booster pump 38A via a bellows 74A as a flexible portion. Further, at the other end, the exhaust pipe 34A includes a reduced diameter portion 77A whose diameter is reduced from a middle portion. The reduced diameter portion 77A is connected to the exhaust port 30A of the process container 18A via a bellows 70A as a flexible portion. That is, the booster pump 38A and the process chamber 21A inside the process furnace 4A are configured to be in fluid communication with each other via the exhaust pipe 34A. Further, at the exhaust pipe 34A, a first gate valve 69A, a second gate valve 71A, and a first APC valve 72A are installed sequentially from the side of the booster pump 38A.

The branch exhaust pipe 68A extends upward from between the first gate valve 69A and the second gate valve 71A of the exhaust pipe 34A, and is bent in parallel with the exhaust pipe 34A toward the process furnace 4A. Further, the branch exhaust pipe 68A extends downward via the second APC valve 73A, and is connected between the first APC valve 72A of the exhaust pipe 34A and the reduced diameter portion 77A. That is, the second APC valve 73A is installed at the middle of the branch exhaust pipe 68A. Therefore, by opening and closing the second gate valve 71A, it is possible to control whether to exhaust a gas via the exhaust pipe 34A and the first APC valve 72A or via the branch exhaust pipe 68A and the second APC valve 73A.

Each of the exhaust pipe 34A and the branch exhaust pipe 68A has a divided structure in which a plurality of pipes each having a predetermined shape is combined. That is, the exhaust pipe 34A and the branch exhaust pipe 68A include a plurality of separable sections. The respective pipes are connected via an elastic seal 80A installed to surround a periphery of a connector 100 between the pipes.

The bellows 70A has a bellows structure and is configured to absorb and allow displacement of the exhaust pipe 34A in the circumferential direction and the axial direction with respect to the process container 18A. Similarly, the bellows 74A has a bellows structure and is configured to absorb and allow displacement of the exhaust pipe 34A in the circumferential direction and the axial direction with respect to the booster pump 38A. Further, the bellows 74A includes flange portions 75A protruding in the radial direction at both ends thereof, and shaft-shaped fixing members 76A (FIG. 11) may be hung and attached between the flange portions 75A at predetermined circumferential intervals. The fixing members 76A are, for example, bolts, and may be used to restrain the displacement of the bellows 74A at an arbitrary position during maintenance or the like. Further, the bellows 70A includes a flange 91A at the end on the side of the reduced diameter portion 77A. A holder 92A may be bridged between the flange 91A or the reduced diameter portion 77A and the exhaust port 30A or the frame of the process furnace 4. The holder 92A bears a tensile load generated between both ends of the bellows 70A when the inside of the bellows 70A is vacuumized. The holder 92A may be made of a vibration-damping member such as a polymer resin, rubber, and a compression spring, or a vibration-damping alloy to be described below.

The exhaust box 40A includes a frame 79A installed to hang vertically and horizontally in the exhaust box 40A, and a casing 78A attached to the frame 79A to cover a part or the entirety of the outer side of the frame 79A. The casing 78A includes a side wall panel that is substantially flush with the casing of the booster pump 38A and the process furnace 4A. The frame 79A may include a plurality of beams to which various components accommodated in the exhaust box 40A are attached, and which protrudes toward the exhaust pipe 34A particularly to fix the exhaust pipe 34A and the branch exhaust pipe 68A.

The exhaust pipe 34A and the branch exhaust pipe 68A are connected to the frame 79A via an installation bracket 81A to be described below, and are supported by the frame 79A. The exhaust pipe 34A is fixed to the frame 79A via the installation bracket 81A mainly around two branch portions with the branch exhaust pipe 68A. Further, the branch exhaust pipe 68A is fixed to a beam of the frame 79A via the installation bracket 81A mainly at a protruding portion extending upward from the exhaust pipe 34A and at a protruding portion extending downward from the second APC valve 73A. That is, the connector 100 between the exhaust pipe 34A and the frame 79A and the connector 100 between the branch exhaust pipe 68A and the frame 79A are installed at multiple locations for each divided section on the side closer to the process chamber 21A than the bellows 74A and the first gate valve 69A, respectively.

The exhaust box 40A and the booster pump 38A, the exhaust box 40A and the process furnace 4A, and the process furnace 4A and the transfer chamber 5A may be connected by vibration-damping fasteners 90A formed of a vibration-damping member such as rubber or resin. Further, the booster pump 38A may be installed at the floor via a vibration-damping member such as rubber or resin. Further, the exhaust pipe 34A and the branch exhaust pipe 68A may be maintained at a high temperature to prevent an accumulation of by-products therein in some embodiments. Therefore, a heating wire may be attached to the exhaust pipe 34A and the branch exhaust pipe 68A. The exhaust pipe 34A and the branch exhaust pipe 68A may be covered with a heat insulating cover.

Figure 12:
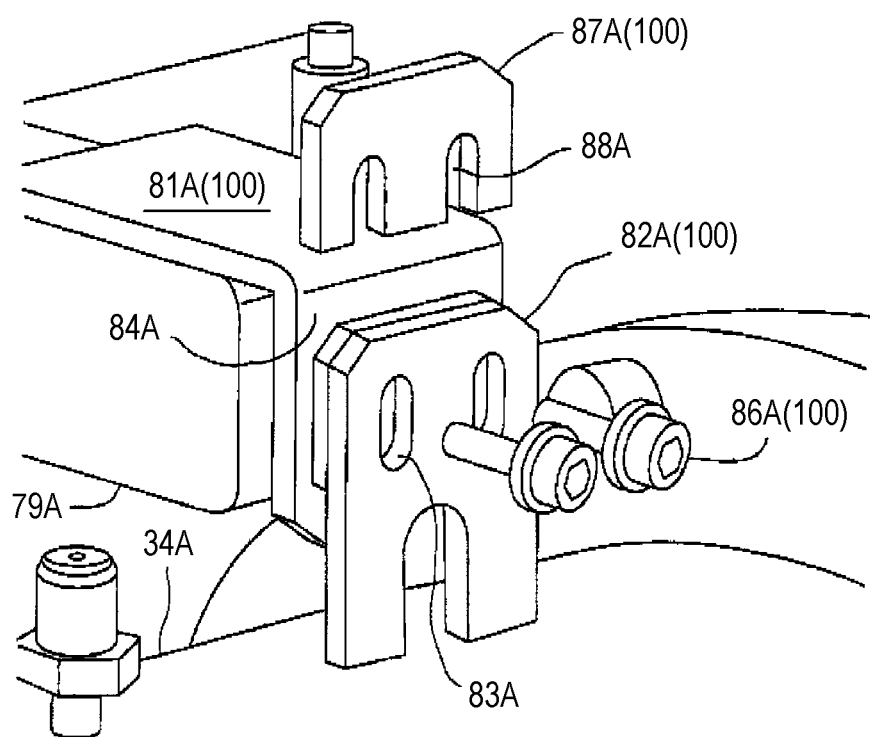
FIG. 12 is a perspective view showing an example of a connector according to embodiments of the present disclosure.

The details of the connector 100 between the exhaust pipe 34A and the frame 79A will be described with reference to FIG. 12. For example, the connector may be comprised of the installation bracket 81A, an installation plate 82A, one or more bolts 86A, and a vibration-damping plate 87A, which are configured to connect the exhaust pipe 34A and the frame 79A. Although the exhaust pipe 34A is illustrated in FIG. 12, the branch exhaust pipe 68A is also connected to the frame 79A in the same manner as the exhaust pipe 34A.

The installation plate 82A extending in the radial direction is formed at a predetermined position on the outer peripheral surface of the exhaust pipe 34. The installation plate 82A includes, for example, two elongated holes 83A extending in an extension direction thereof (in a vertical direction). Further, an installation bracket 81A having an L-shaped cross section is installed at a tip of the frame 79A, and an installation surface 84A including a screw hole and being in parallel to the installation plate 82A is formed.

One or more vibration-damping plates 87A as vibration-dampers are installed between the installation plate 82A and the installation surface 84A. The vibration-damping plates 87A are metal plates having the number and size corresponding to those of the elongated holes 83A and including elongated holes 88A with open lower ends. When connecting the exhaust pipe 34A to the frame 79A, the bolts 86A are loosely screwed into the screw holes of the installation surface 84A, the elongated holes 88A of the vibration-damping plates 87A are put on the bolts 86A in this state, and then the bolts 86A are tightened while holding the exhaust pipe 34 at an appropriate height. As a result, the vibration-damping plate 87A is screwed to the installation surface 84A integrally with the installation plate 82A.

The vibration-damping plate 87A is installed to be sandwiched between the installation surface 84A (installation bracket 81A) and the installation plate 82A when the frame 79A and the exhaust pipe 34A are connected. Therefore, the vibration-damping plate 87A supports the entirety or a part of the weight of the exhaust pipe 34 as a shear load in a direction parallel to the surface of the vibration-damping plate 87A. That is, the shear load is perpendicular to a thickness direction of the vibration-damping plate 87A. The remaining part of the weight of the exhaust pipe 34 may be supported by the bolts 86A a little bit. Therefore, the vibration-damping plate 87 supports substantially the entire load.

Vibration-damping characteristics of the vibration-damping plate 87A may be expressed by a logarithmic decrement $\delta$, a natural decrement capacitance $\Psi$, a resonance sharpness Q, a loss coefficient $\eta$, and the like, which are defined as follows.

$$\Psi = \Delta W/2W,$$

$$Q = \omega_0/(\omega_2 - \omega_1)$$

$$\eta = f_1/f_2$$

W and $\Delta W$ are mechanical energies related to vibration, and $\Delta W$ is an energy loss per cycle. Further, $\omega_0$, $\omega_1$ and $\omega_2$ are a resonance frequency at a resonance peak, a frequency at which the vibration energy is a half of the resonance peak on the left side of the resonance peak, and a frequency at which the vibration energy is a half of the resonance peak on the right side of the resonance peak, respectively. Further, $f_1$ and $f_2$ are a force at the maximum displacement and a force at zero displacement, respectively, in a hysteresis loop represented by a stress/strain diagram. The logarithmic decrement $\delta$ is defined as a ratio of adjacent amplitudes when the amplitude decays. When the logarithmic decrement is small ($\delta$<0.01), a relationship of $\delta \approx 2\Psi \approx \pi\eta \approx 2\pi/Q$ holds. The logarithmic decrement usually depends on the amplitude and frequency. However, the maximum logarithmic decrement of the vibration-damping plate 87A of the embodiments is larger than a logarithmic decrement (about 0.02) of SUS304 stainless steel which is a general material that is used to form a semiconductor manufacturing apparatus. Specifically, the vibration-damping plate 87A has a logarithmic decrement of 0.1 or more with respect to vibration of amplitude or frequency to be attenuated. The vibration-damping plate 87A has characteristics of distributing resonance points of vibration on a frequency axis and attenuating a mechanical vibration.

As the material of the vibration-damping plate 87A, for example, a composite type, ferromagnetic type, transition type, or twin crystal type vibration-damping alloy may be used. The composite type vibration-damping alloy such as cast iron and aluminum-zinc alloy has characteristics of converting vibration into heat by a viscous elastic body that covers a phase boundary of a two-phase mixed structure, and absorbing and relaxing the vibration.

The ferromagnetic type vibration-damping alloy found in alloys exhibiting magnetic strain such as nickel or chromium steel has characteristics of having crystals randomly distorted in a direction of spontaneous magnetization in each magnetic domain, generating strain within an elastic limit of the material as the magnetic domain is rotated in such a direction as to relax stress by applying an external force, and contracting due to the removal of an external force. When vibration occurs, the vibration-damping alloy expands and contracts by repeatedly applying and removing an external force, whereby the vibration may be converted into heat by generating a hysteresis loop and the vibration may be damped. Further, in the case of the ferromagnetic type vibration-damping alloy, the vibration-damping effect may be enhanced by coarsening crystal grains by heat treatment and facilitating movement of a magnetic domain wall.

The transition type vibration-damping alloy such as a magnesium alloy has characteristics of attenuating vibration by an interaction between the transition in the alloy and the impurity atom. When an external force is applied to the transition pinned by the impurity atom, the transition in the alloy overhangs and moves. When the external force is removed, the transition moves to the original position. When vibration occurs, the transition in the crystal moves due to the repeated application and removal of an external force, whereby the vibration may be converted into heat by generating a hysteresis loop and the vibration may be damped.

The twin crystal type vibration-damping alloy has characteristics of attenuating vibration due to twin crystals in slip and twin crystal deformation that occur to relax martensite due to heat treatment. Further, the twin crystal type vibration-damping alloy may be further classified into two types, that is, a relaxation type such as a twin crystal copper-manganese alloy and a hysteresis type such as a copper-aluminum-nickel alloy. The relaxation type has characteristics of converting vibration into heat at a twin crystal boundary in martensite by an action similar to that of a complex phase boundary, and absorbing and damping the vibration. In addition, the hysteresis type has characteristic of damping vibration by generating a hysteresis loop and converting vibration into heat as a twin crystal interface is irreversibly moved by an external force through a mechanism similar to that of the transition type.

Figure 13A:
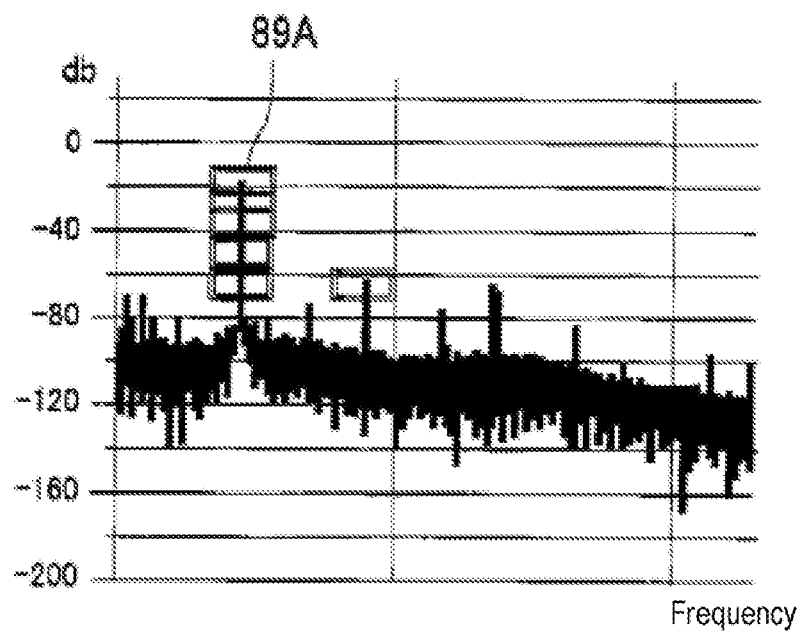
FIG. 13A is a graph showing a relationship between a vibration and a frequency when a vibration-damping plate is not installed at the connector.
Figure 13B:
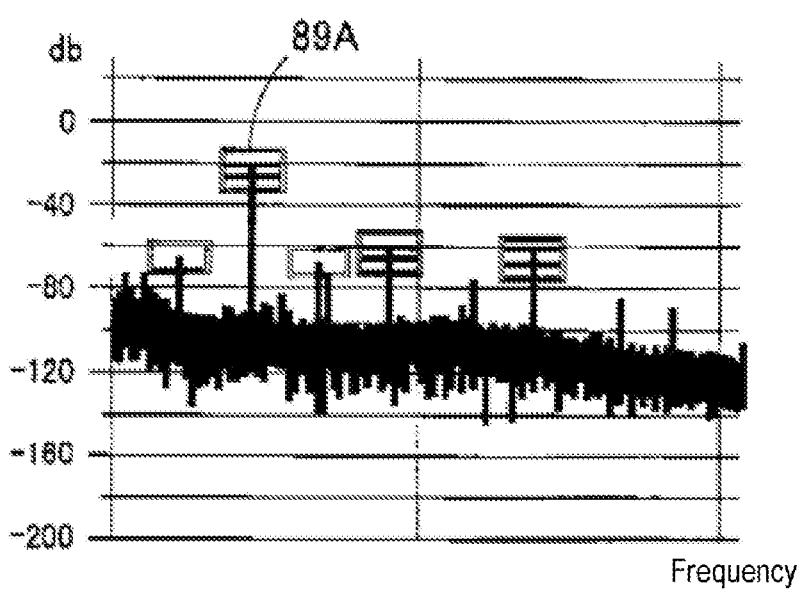
FIG. 13B is a graph showing a relationship between a vibration and a frequency when a vibration-damping plate is installed at the connector.

FIG. 13A is a graph showing a relationship between vibration and frequency when the vibration-damping plate 87A is not installed at the connector 100 between the frame 79A and the exhaust pipe 34A, and FIG. 13B is a graph showing a relationship between vibration and frequency when the vibration damping plate 87A made of an iron-aluminum alloy is installed at the connector 100 between the frame 79A and the exhaust pipe 34A. In each graph, rectangular markers are added to eight top peaks.

As shown in FIG. 13A, when the vibration-damping plate 87A is not installed, resonance points 89A of vibration may be concentrated in a specific narrow range on the frequency axis, thereby generating resonance and increasing the amplitude. On the other hand, as shown in FIG. 13B, when the vibration-damping plate 87A is installed, the resonance points 89A of vibration are distributed on the frequency axis. Therefore, it is possible to reduce the amplitude.

As described above, in the embodiments, when the exhaust pipe 34A is attached to the frame 79A, the vibration-damping plate 87A as a vibration-damper is installed between the installation plate 82A of the exhaust pipe 34A and the installation surface 84A of the frame 79A. Therefore, the vibration transmitted from the booster pump 38A to the exhaust pipe 34A is damped by the vibration-damping plate 87A when reaching the connector 100 with the frame 79A. Thus, the vibration may be sufficiently damped in the process of the vibration being transmitted from the booster pump 38A to the process furnace 4A via the exhaust pipe 34A.

Further, the bellows 74A is installed between the exhaust pipe 34A and the booster pump 38A, and the flange portions 75A of the bellows 74A are not fixed. Since the bellows 74A may absorb the displacement of the exhaust pipe 34A with respect to the booster pump 38A, it is possible to suppress the large-amplitude vibration transmitted from the booster pump 38A to the exhaust pipe 34A.

Further, since the booster pump 38A and the exhaust box 40A are connected by the vibration-damping fastener 90A, it is possible to reduce the vibration transmitted from the booster pump 38A to the exhaust box 40A.

Further, since the vibration-damping plate 87A is made of heat-resistant metal, the exhaust temperature from the process furnace 4A may increase without deteriorating the vibration-damping plate. Alternatively, the heating temperature for the exhaust pipe 34A may be raised.

Further, the vibration-damping plate 87A includes elongated holes 88A with open lower ends, and may be directly attached to a vertical surface without using a suspension device. Therefore, the vibration-damping plate 87A may be applied even when a large shear load that may not be withstood by rubber or resin acts.

Figure 14:
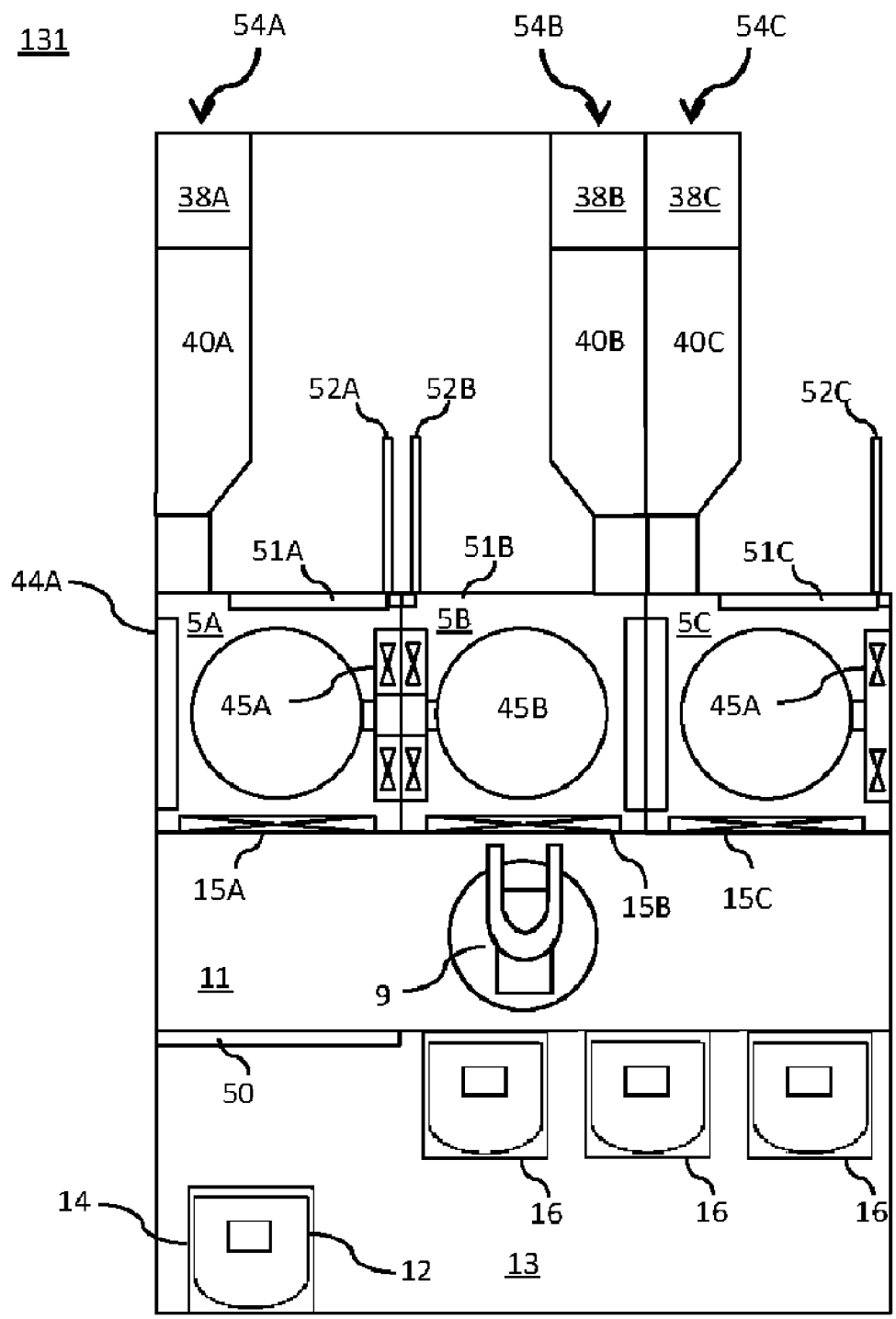
FIG. 14 is a top view showing a modification of a substrate processing apparatus according to embodiments of the present disclosure.

FIG. 14 shows a substrate processing apparatus 131 according to another modification, which includes three processing modules. The three processing modules 2A, 2B, and 2C are arranged side by side continuously in a lateral direction on a rear side of the delivery chamber 11. The processing modules 2A and 2B and the corresponding utility systems 54A and 54B are arranged plane-symmetrically with each other. The processing modules 2B and 2C and the corresponding utility systems 54B and 54C are arranged plane-symmetrically with each other to be adjacent to each other on a side surface that does not face a maintenance area. The delivery chamber 11 has a lateral width corresponding to a sum of lateral widths of the three processing modules 2A, 2B and 2C.

The substrate processing apparatus 131 may also be configured in an arrangement (referred to as arrangement B) that is in a mirror image relationship with an arrangement (referred to as arrangement A) shown in FIG. 14. By arranging apparatuses of arrangement A and arrangement B alternately in the lateral direction, the maintenance area behind the processing module 2C of the substrate processing apparatus 131 of arrangement A and the maintenance area behind the processing module 2C of the substrate processing apparatus 131 of arrangement B may form one continuous space. Similar to the maintenance area between the utility systems 54A and 54B, the space has a width large enough to remove or install the processing module 2C via a maintenance door 51C. When the cluster-type substrate processing apparatuses 131 of the arrangement A and the arrangement B are paired in the way, a configuration that does not need an access from the side surface of the apparatus may be realized on a one-pair unit basis, and a productivity per footprint may be improved.

Figure 15:
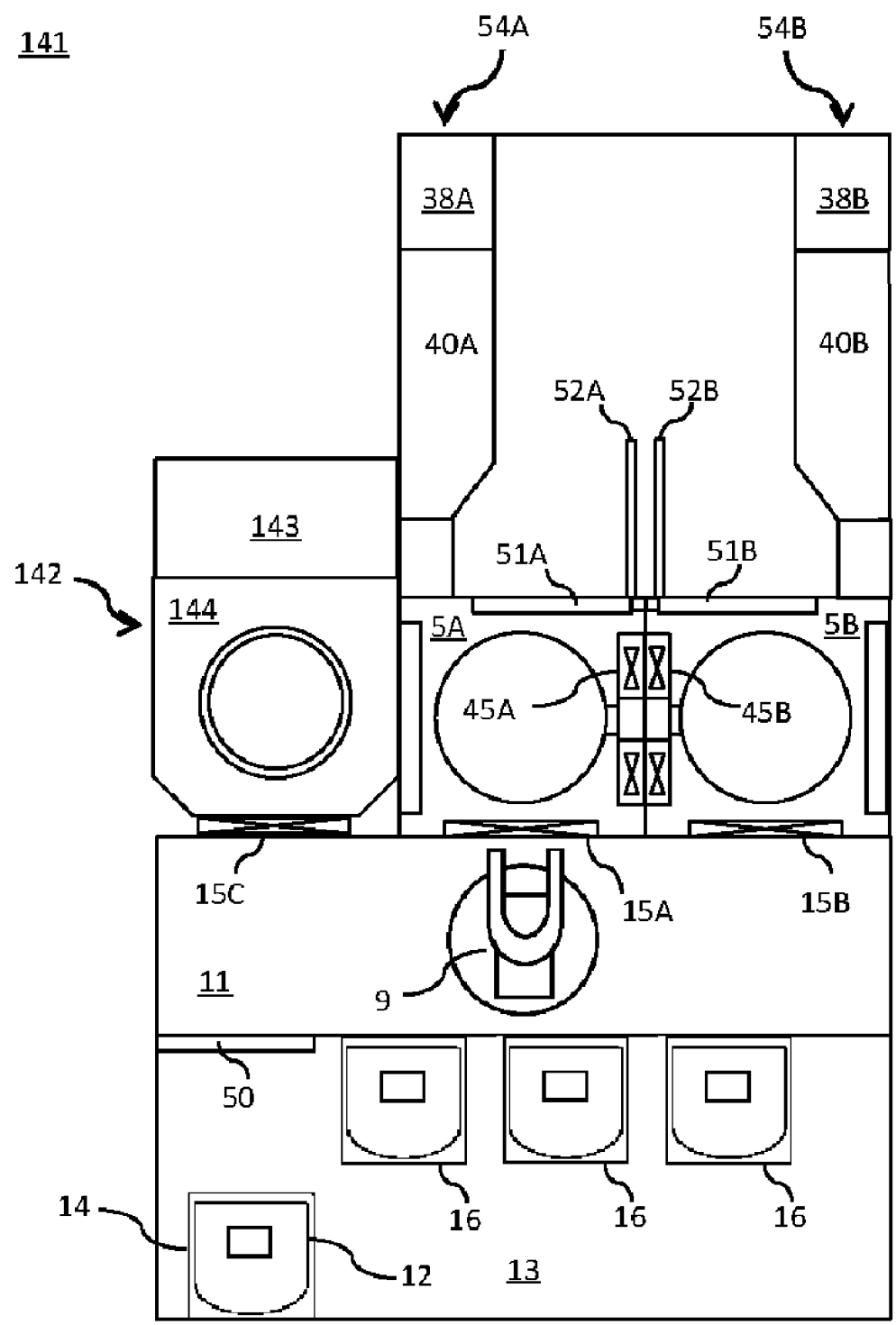
FIG. 15 is a top view showing another modification of a substrate processing apparatus according to embodiments of the present disclosure.
Figure 16:
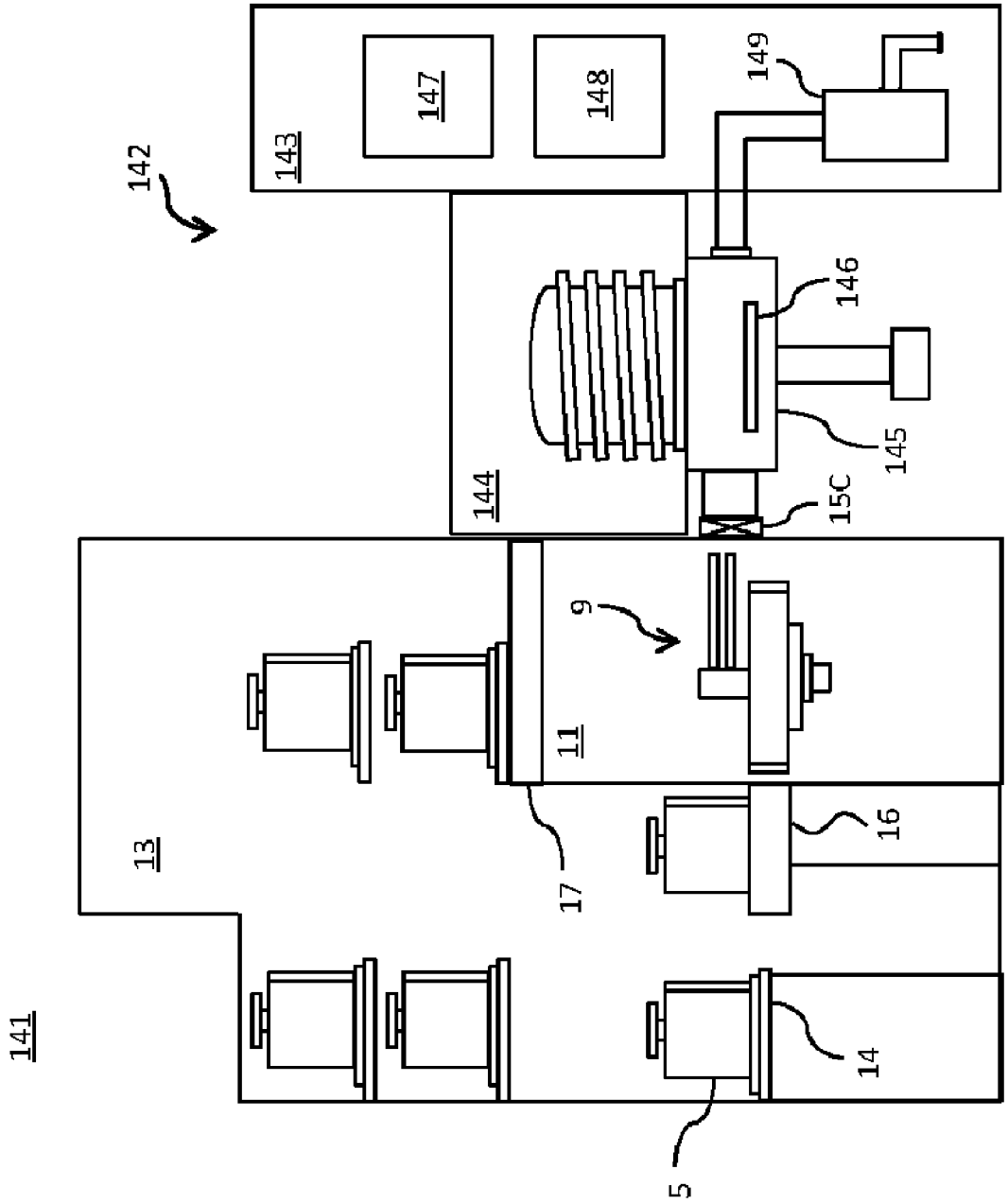
FIG. 16 is a horizontal cross-sectional view showing another modification of a substrate processing apparatus according to embodiments of the present disclosure.

FIGS. 15 and 16 show a substrate processing apparatus 141 of another modification including three processing modules. The three processing modules 2A, 2B, and 142 have substantially the same lateral width or a lateral width of 1 m or less, and are arranged side by side in a lateral direction on a rear side of a delivery chamber 11. The processing module 142 includes a housing 144 configured to accommodate a single-wafer chamber in which a wafer 8 accommodated one by one is processed with radicals, and a lower chamber 145 configured to form a space that is in fluid communication with the single-wafer chamber to load or unload the wafer 8 into or out of the single-wafer chamber. A susceptor 146 moves up or down between the single-wafer chamber and the lower chamber 145 while mounting the wafer 8 thereon.

The processing module 142 may expose the wafer 8 to, for example, radicals such as oxygen, nitrogen, hydrogen, or a rare gas to perform modification or treatment processing such as isotropic oxidation. For example, in a continuous process in which an oxide film is formed on the wafer 8 by the processing module 2A and then a nitride film is formed by the processing module 2B, interface characteristics of the film maybe improved by interposing short-time processing by the processing module 142 before the nitride film formation. At this time, the wafer 8 may be transferred in the order of the processing modules 2A, 142 and 2B without leaving the delivery chamber 11. A cassette configured to temporarily hold the wafer 8 or a cooling station may be installed in a space in the delivery chamber 11 that is not used in delivery. The substrate processing apparatus 141 may realize a high throughput with high transfer efficiency.

The utility system 143 is a supplementary facility of the processing module 142 and has a longitudinally elongated box-like outer shape. The utility system 143 is arranged adjacent to a rear surface of the housing 144. The utility system 143 accommodates a supply box 147 configured to store a valve and the like configured to supply a gas to the single-wafer chamber, a high-frequency power source 148 configured to supply high-frequency power that generate a plasma in the single-wafer chamber, and an exhaust system 149 including an exhaust pipe and the like configured to vacuum-exhaust the single-wafer chamber and the lower chamber 145. The utility system 143 may include wheels such as swivel casters or the like on a bottom of the utility system 143, and may be configured to be movable in a front-rear direction.

A typical apparatus including a cluster of single-wafer chambers often uses a structure in which the entire single-wafer chamber is rotatably supported by vertical pivots installed at corners of the apparatus such that each of the single-wafer chambers may be maintained. The processing module 142 of the substrate processing apparatus 141 installed independently faces a space having a sufficient space on the rear surface and one side surface thereof, and the pivots may be omitted. Furthermore, as for the substrate processing apparatus 151, the apparatus of an arrangement shown in FIG. 15 (referred to as arrangement A) and the apparatus of an arrangement (referred to as arrangement B) having a mirror image relationship with the arrangement A may be alternately arranged in the lateral direction.

Figure 17:
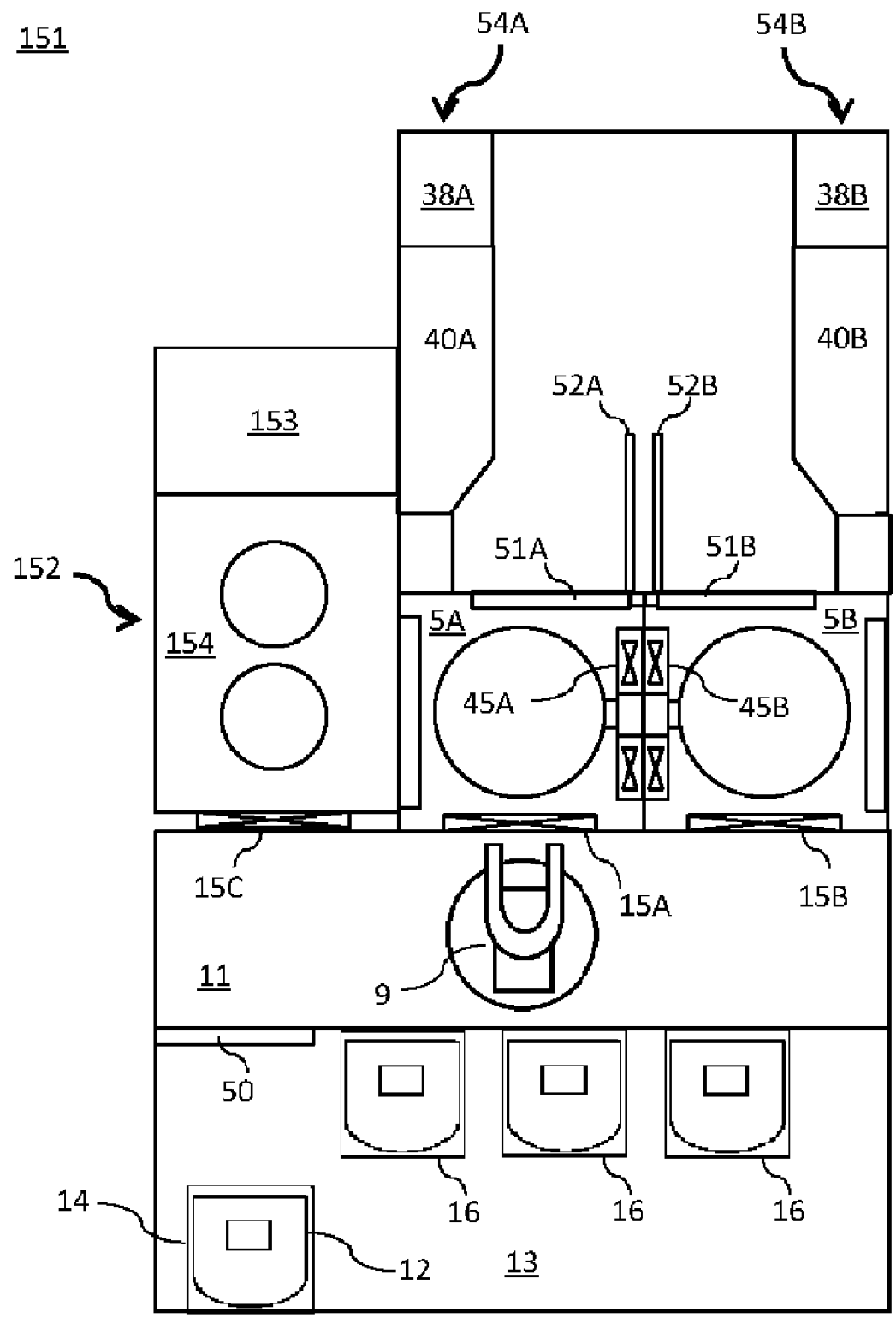
FIG. 17 is a top view showing another modification of a substrate processing apparatus according to embodiments of the present disclosure.
Figure 18:
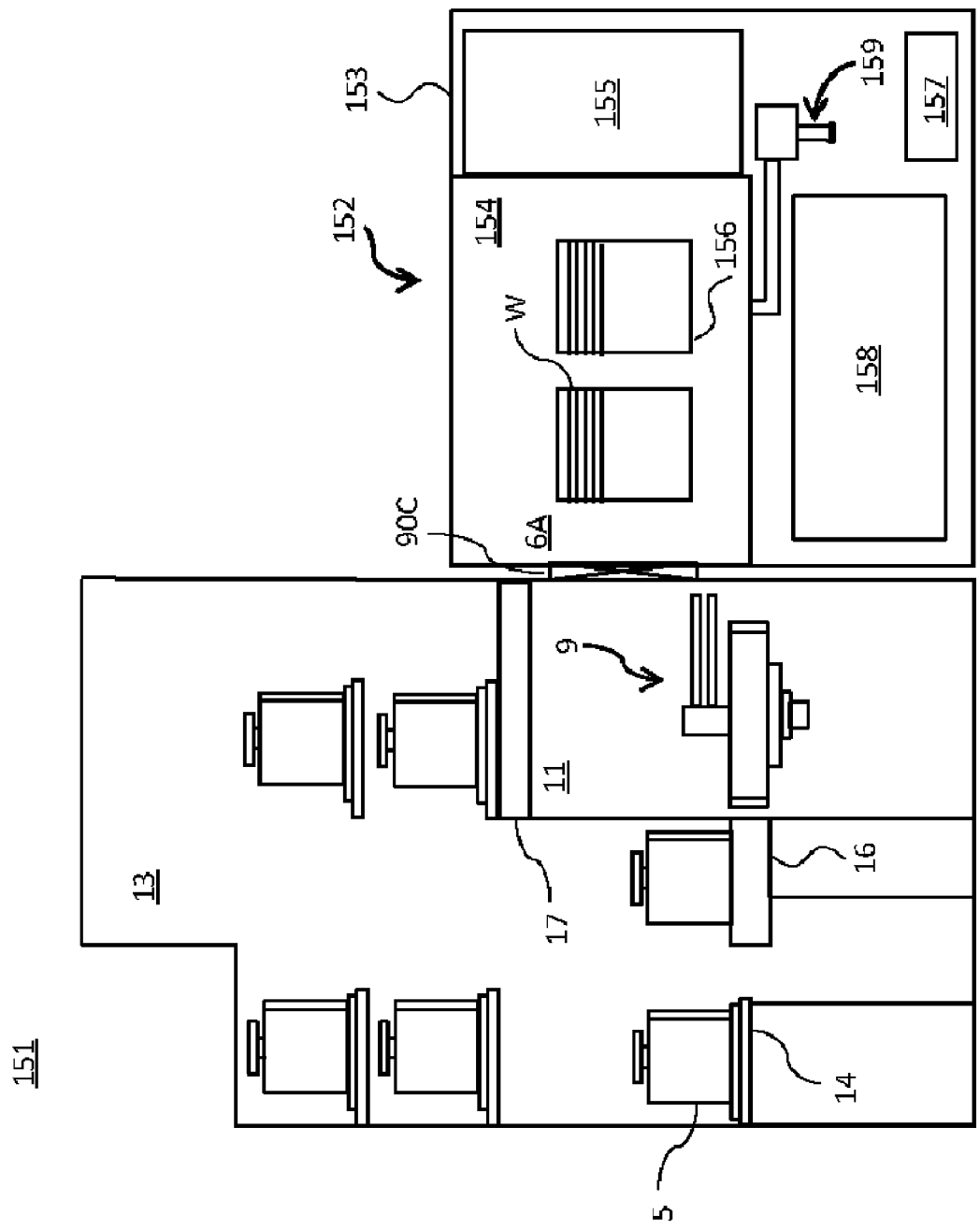
FIG. 18 is a horizontal cross-sectional view showing another modification of a substrate processing apparatus according to embodiments of the present disclosure.

FIGS. 17 and 18 show a cluster-type substrate processing apparatus 151 of another modification including three processing modules. The three processing modules 2A, 2B, and 152 have substantially the same lateral width or a lateral width of 1 m or less, and are arranged side by side in the lateral direction on the rear side of the delivery chamber 11. The processing module 152 includes a housing 154 accommodating a cavity configured to anneal a plurality of wafers 8 with electromagnetic waves.

The utility system 153 is a supplementary facility of the processing module 152, and is arranged adjacent to the rear surface and the bottom surface of the housing 154 to accommodate a microwave generator 155, a supply box 157, a power supply device 158, and an exhaust system 159. The microwave generator 155 generates a microwave of from 2.45 to 27 GHz and radiates the microwave into the cavity. The supply box 157 stores a valve and the like configured to supply a processing gas to the single-wafer chamber. The power supply device 158 supplies a power to the microwave generator 155. The exhaust system 159 includes an exhaust pipe and an exhaust valve configured to exhaust an inside of the cavity.

The processing module 152 generates a standing microwave wave in the cavity in a state in which the wafer 8 is held on one or two rotating boats 156 in the cavity. Since the microwave specifically and rapidly heats a specific solid phase film or impurities formed on the wafer 8, a predetermined heat treatment such as annealing may be performed while avoiding other films and the wafer 8 from becoming too hot. For example, in a continuous process in which film A is formed on the wafer 8 by the processing module 2A and then film B is formed by the processing module 2B, the annealing by the processing module 152 is performed prior to the formation of film B, whereby characteristics of the film already formed on the wafer 8 may be corrected or a quality of the film formed subsequently may be improved.

The processing module 152 may be mounted on the utility system 143. The utility system 143 includes wheels such as swivel casters on a bottom thereof, and may be configured to be movable in the front-rear direction while mounting the processing module 152 thereon. An operator may enter the delivery chamber 11 via the maintenance port 50 and may separate or connect the delivery chamber 11 and the gate valve 15C.

Aspects of Present Disclosure

The present disclosure includes the following aspects.

Supplementary Note 1

According to some embodiments of the present disclosure, there is provided a substrate processing apparatus, comprising: a first processing module including a first process container in which a substrate is processed and a substrate loading port installed on a front side; a second processing module arranged close to a side surface of the first processing module and including a second process container in which the substrate is processed; a first utility system arranged close to a rear surface of the first processing module and including a first supply system configured to supply a processing gas into the first process container; a second utility system arranged close to a rear surface of the second processing module and including a second supply system configured to supply a processing gas into the second process container; a first vacuum-exhauster arranged behind the first processing module and configured to exhaust an inside of the first process container; and a second vacuum-exhauster arranged behind the second processing module and configured to exhaust an inside of the second process container, wherein outer side surfaces of the first vacuum-exhauster and the second vacuum-exhauster are configured such that the outer side surfaces do not protrude more outward than outer side surfaces of the first utility system and the second utility system respectively.

Supplementary Note 2

In the substrate processing apparatus of Supplementary Note 1, the first exhaust port is formed such that an exhaust gas is taken out in a direction orthogonal to a pipe axis of the first process container.

According to some embodiments of the present disclosure, it is possible to improve an exhaust efficiency (exhaust speed) while suppressing a variation (apparatus difference) in exhaust characteristics among a plurality of substrate processing apparatuses.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
a processing module including a process container in which at least one substrate is processed and a first gate valve installed at a front side of the processing module;
a utility system including a supply system configured to supply a processing gas into the process container, a surface of the utility system is connected or arranged close to a rear surface of the processing module;
a vacuum-exhauster arranged behind the processing module and configured to exhaust an inside of the process container;
an exhaust pipe configured to bring the process container into fluid communication with the vacuum-exhauster;
a pipe housing configured to support the exhaust pipe; and
a first vibration-damping fastener connecting the vacuum-exhauster and the pipe housing,
wherein the exhaust pipe includes a first flexible portion configured to allow displacement of an end of the exhaust pipe and installed outside the vacuum-exhauster, and
wherein the vacuum-exhauster and the pipe housing are installed at a floor.

2. The substrate processing apparatus of claim 1, wherein the first vibration-damping fastener and the first flexible portion are configured to be capable of suppressing a vibration transmitted from the vacuum-exhauster to the process container.

3. The substrate processing apparatus of claim 1, wherein the pipe housing is installed outside the processing module, and includes a frame and a panel configured to cover an outside of the frame, and
wherein the pipe housing further includes a vibration-damper which is installed on at least one connector between the frame and the exhaust pipe.

4. The substrate processing apparatus of claim 1, further comprising a second vibration-damping fastener which connects the processing module and the pipe housing, and
wherein the first vibration-damping fastener and the second vibration-damping fastener are made of resin or rubber.

5. The substrate processing apparatus of claim 3, wherein the first flexible portion is installed on a side of the exhaust pipe adjacent to the vacuum-exhauster, and the at least one connector is installed closer to the process container than the first flexible portion.

6. The substrate processing apparatus of claim 3, wherein the first flexible portion is further configured such that a fixer configured to fix both ends of the first flexible portion is attachable to the first flexible portion.

7. The substrate processing apparatus of claim 1, wherein the vacuum-exhauster and the pipe housing are installed at the floor so that an air intake port of the vacuum-exhauster is at the same height as an exhaust port of the process container.

8. The substrate processing apparatus of claim 3, wherein the vibration-damper is made of a vibration-damping alloy that absorbs mechanical vibration, and the first vibration-damping fastener is made of resin or rubber.

9. The substrate processing apparatus of claim 1, wherein the exhaust pipe includes a plurality of separable sections connected via elastic seals, and at least one connector is installed at each of the sections.

10. The substrate processing apparatus of claim 1, wherein the exhaust pipe includes a second flexible portion configured to allow displacement of another end of the exhaust pipe, and
wherein the apparatus further comprises a holder that bridges both sides of the second flexible portion to bear a load generated between the both sides of the second flexible portion, and is made of a vibration-damping member.

11. The substrate processing apparatus of claim 3, wherein the vibration-damper has a plate-shape, and
wherein the vibration-damper is configured to support at least a portion of a gravity applied to the exhaust pipe as a shear load in a direction parallel to a plate-shaped surface of the vibration-damper.

12. The substrate processing apparatus of claim 1, wherein the vacuum-exhauster is a pump having a rotor rotating shaft extending in a vertical direction.

13. The substrate processing apparatus of claim 1, wherein the vacuum-exhauster is installed at the floor via a vibration-damping member.

14. A substrate processing apparatus, comprising:
a processing module including a process furnace in which at least one substrate is processed and a first gate valve installed at a front side of the processing module;
a utility system including a supply system configured to supply a processing gas into the process furnace, a surface of the utility system is connected or arranged close to a rear surface of the processing module;
a vacuum-exhauster arranged behind the processing module and configured to exhaust an inside of the process furnace;
an exhaust pipe configured to bring the process furnace into fluid communication with the vacuum-exhauster;
a pipe housing configured to support the exhaust pipe; and
a first vibration-damper fastener connecting the vacuum-exhauster and the pipe housing,
wherein the exhaust pipe includes a first flexible portion configured to allow displacement of an end of the exhaust pipe and installed outside the vacuum-exhauster.

15. The substrate processing apparatus of claim 14, wherein the exhaust pipe further includes a connector connecting the exhaust pipe to the pipe housing at a position closer to the process furnace than the first flexible portion.

16. The substrate processing apparatus of claim 14, wherein the vacuum-exhauster and the pipe housing are installed at a floor.

17. A substrate processing method comprising:
providing the substrate processing apparatus of claim 1; and
processing the at least one substrate in the process container while damping a vibration transmitted from the vacuum-exhauster to the process container via the exhaust pipe.

18. A method of manufacturing a semiconductor device comprising the substrate processing method of claim 17.

19. The substrate processing apparatus of claim 1, wherein the pipe housing is installed outside the processing module, and includes a frame, a panel configured to cover an outside of the frame and at least one connector connecting the exhaust pipe to the frame.

20. The substrate processing apparatus of claim 19, wherein the first vibration-damping fastener is configured to be capable of suppressing transmission of a vibration from the vacuum-exhauster to the process container through the pipe housing, and
wherein the first flexible portion is configured to be capable of suppressing the vibration transmitted from the vacuum-exhauster to the process container through the exhaust pipe.

* * * * *